(12) United States Patent
Toyotaka et al.

(10) Patent No.: US 11,513,409 B2
(45) Date of Patent: Nov. 29, 2022

(54) DISPLAY DEVICE

(71) Applicant: Semiconductor Energy Laboratory Co., Ltd., Kanagawa-ken (JP)

(72) Inventors: Kouhei Toyotaka, Kanagawa (JP); Koji Kusunoki, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 17/042,326

(22) PCT Filed: Mar. 22, 2019

(86) PCT No.: PCT/IB2019/052328
§ 371 (c)(1),
(2) Date: Sep. 28, 2020

(87) PCT Pub. No.: WO2019/186339
PCT Pub. Date: Oct. 3, 2019

(65) Prior Publication Data
US 2021/0026176 A1 Jan. 28, 2021

(30) Foreign Application Priority Data

Mar. 30, 2018 (JP) .............................. JP2018-066787

(51) Int. Cl.
*G02F 1/1368* (2006.01)
*H01L 27/12* (2006.01)
(52) U.S. Cl.
CPC ........ *G02F 1/1368* (2013.01); *H01L 27/1225* (2013.01)
(58) Field of Classification Search
CPC ........................... G02F 1/1368; H01L 27/1225
(Continued)

(56) References Cited

U.S. PATENT DOCUMENTS 5,650,636 A 7/1997 Takemura et al.
5,717,224 A 2/1998 Zhang
(Continued)

FOREIGN PATENT DOCUMENTS

CN 105009299 A 10/2015
CN 207337002 U 5/2018
(Continued)

OTHER PUBLICATIONS

International Search Report (Application No. PCT/IB2019/052328) dated Jul. 2, 2019.
(Continued)

*Primary Examiner* — Charles S Chang
(74) *Attorney, Agent, or Firm* — Husch Blackwell LLP

(57) ABSTRACT

A highly visible display device is provided. The display device includes a transistor, a first conductive layer, a second conductive layer, and a third conductive layer. The channel width of the transistor is greater than or equal to 30 μm and less than or equal to 1000 μm. The transistor includes 2 to 50 semiconductor layers, each of which includes a first region, a second region, and a channel formation region. The channel formation region has a region overlaps with the first conductive layer. The first region overlaps with the second conductive layer and does not overlap with the first conductive layer. The second region overlaps with the third conductive layer and does not overlap with the first conductive layer. The third conductive layer has a function of transmitting visible light, and the second region and the third conductive layer in a stacked state have a function of transmitting visible light.

11 Claims, 14 Drawing Sheets

(58) Field of Classification Search
USPC .................................................. 349/42–47
See application file for complete search history.

(56) References Cited

U.S. PATENT DOCUMENTS

| | | | |
|---|---|---|---|
| 5,990,491 A | 11/1999 | Zhang | |
| 6,501,097 B1 | 12/2002 | Zhang | |
| 6,576,926 B1 | 6/2003 | Yamazaki et al. | |
| 6,800,873 B2 | 10/2004 | Zhang | |
| 7,102,164 B2 | 9/2006 | Zhang | |
| 7,423,291 B2 | 9/2008 | Zhang | |
| 7,609,310 B2 | 10/2009 | Miyagawa | |
| 7,863,612 B2 | 1/2011 | Sato | |
| 8,319,715 B2 | 11/2012 | Zhang | |
| 8,941,127 B2 | 1/2015 | Koyama et al. | |
| 9,705,001 B2 | 7/2017 | Yamazaki | |
| 10,256,347 B2 | 4/2019 | Yamazaki | |
| 10,545,377 B2 | 1/2020 | Mizuno et al. | |
| 11,183,137 B2 | 11/2021 | Toyotaka et al. | |
| 11,302,278 B2 | 4/2022 | Kawashima et al. | |
| 11,322,442 B2 | 5/2022 | Koezuka et al. | |
| 2007/0138941 A1* | 6/2007 | Jin | H01L 27/3244 313/503 |
| 2010/0224872 A1 | 9/2010 | Kimura | |
| 2011/0240998 A1* | 10/2011 | Morosawa | H01L 29/7869 257/57 |
| 2012/0188478 A1* | 7/2012 | Kuwabara | G02F 1/136286 349/43 |
| 2014/0264324 A1 | 9/2014 | Yamazaki | |
| 2015/0198850 A1 | 7/2015 | Tasaka et al. | |
| 2017/0243978 A1* | 8/2017 | Lee | H01L 29/0649 |
| 2018/0031758 A1 | 2/2018 | Mizuno et al. | |
| 2019/0317374 A1 | 10/2019 | Yamazaki et al. | |
| 2020/0150490 A1 | 5/2020 | Mizuno et al. | |
| 2020/0194527 A1 | 6/2020 | Kawashima et al. | |
| 2020/0287049 A1* | 9/2020 | Jang | H01L 27/3262 |
| 2021/0096409 A1 | 4/2021 | Toyotaka et al. | |
| 2021/0110783 A1 | 4/2021 | Kawashima et al. | |

FOREIGN PATENT DOCUMENTS

| | | |
|---|---|---|
| JP | 06-160902 A | 6/1994 |
| JP | 07-302912 A | 11/1995 |
| JP | 11-109349 A | 4/1999 |
| JP | 2002-323707 A | 11/2002 |
| JP | 2008-197519 A | 8/2008 |
| JP | 2011-227477 A | 11/2011 |
| JP | 2014-052634 A | 3/2014 |
| JP | 2014-199924 A | 10/2014 |
| JP | 2018-021974 A | 2/2018 |
| KR | 2015-0129825 A | 11/2015 |
| WO | WO 2014/013961 A1 | 1/2014 |
| WO | WO 2014/142333 A1 | 9/2014 |
| WO | WO 2019/135147 A1 | 7/2019 |
| WO | WO 2019/162801 A1 | 8/2019 |
| WO | WO 2019/162808 A1 | 8/2019 |

OTHER PUBLICATIONS

Written Opinion (Application No. PCT/IB2019/052328) dated Jul. 2, 2019.

* cited by examiner

DISPLAY DEVICE

This application is a 371 of international application PCT/IB2019/052328 filed on Mar. 22, 2019 which is incorporated herein by reference.

TECHNICAL FIELD

One embodiment of the present invention relates to a display device, a display module, and an electronic device. One embodiment of the present invention relates to a liquid crystal display device, in particular.

Note that one embodiment of the present invention is not limited to the above technical fields. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

Flat panel displays typified by liquid crystal display devices and light-emitting display devices are widely used as display devices. In Patent Document 1, examples of a pixel portion and a driver circuit of a notation device are described.

In recent years, a technique for using a transistor including a metal oxide for a pixel of a display device has been developed. Patent Document 2 discloses a technique in which a transistor including a metal oxide as a semiconductor material is used for a switching element or the like in a pixel of a display device.

REFERENCE

Patent Document

[Patent Document 1] Japanese Published Patent Application No. 2014-052634
[Patent Document 2] Japanese Published Patent Application No. 2011-227477

SUMMARY OF THE INVENTION

Problems to be Solved by the Invention

An object of one embodiment of the present invention is to provide a high-definition display device. Another object of one embodiment of the present invention is to provide a display device with low power consumption. Another object of one embodiment of the present invention is to provide a highly reliable display device. Another object of one embodiment of the present invention is to provide a display device with high visibility.

Another object of one embodiment of the present invention is to provide a liquid crystal display device with a high aperture ratio. Another object of one embodiment of the present invention is to provide a high-definition liquid crystal display device.

Note that the descriptions of these objects do not preclude the existence of other objects. One embodiment of the present invention does not need to achieve all the objects. Other objects can be derived from the descriptions of the specification, the drawings, and the claims.

Means for Solving the Problems

One embodiment of the present invention is a display device including a transistor, a first conductive layer, a second conductive layer, and a third conductive layer, in which the channel width of the transistor is greater than or equal to 30 μm and less than or equal to 1000 μm, the transistor includes a plurality of semiconductor layers, the number of the plurality of semiconductor layers is greater than 2 and less than or equal to 50, each of the plurality of semiconductor layers includes a channel formation region, a first region, and a second region, the channel formation region of each of the plurality of semiconductor layers is sandwiched between the first region and the second region when seen from above, the channel formation region of each of the plurality of semiconductor layers contains a metal oxide, the metal oxide contains at least indium or zinc, the channel formation region of each of the plurality of semiconductor layers includes a region overlapping with the first conductive layer, the first region overlaps with the second conductive layer and does not overlap with the first conductive layer, the second region overlaps with the third conductive layer and does not overlap with the first conductive layer, the third conductive layer has a function of transmitting visible light, and the second region and the third conductive layer in a stacked state have a function of transmitting visible light.

In the above structure, the width of the channel formation region of each of the plurality of semiconductor layers is preferably greater than or equal to 2 μm and less than or equal to 300 μm.

In the above structure, it is preferable that the first region function as one of a source region and a drain region of the transistor, the second region function as the other of the source region and the drain region of the transistor, the first region and the second region have electrical resistance lower than electrical resistance of the channel formation region, and the first region and the second region contain boron or phosphorus.

In the above structure, the display device preferably has a function of performing display by a field-sequential driving method.

In the above structure, it is preferable that the display device include a liquid crystal element, the liquid crystal element be a light-scattering liquid crystal element, and the liquid crystal element scatter light when being on and transmit light when being off.

Effect of the Invention

One embodiment of the present invention can provide a high-definition display device. One embodiment of the present invention can provide a display device with low power consumption. One embodiment of the present invention can provide a highly reliable display device. One embodiment of the present invention can provide a display device with high visibility.

One embodiment of the present invention can provide a liquid crystal display device with a high aperture ratio. One embodiment of the present invention can provide a high-definition liquid crystal display device.

Note that the descriptions of the effects do not preclude the existence of other effects. One embodiment of the present invention does not need to have all the effects. Other

MODE FOR CARRYING OUT THE INVENTION

Figure 1:
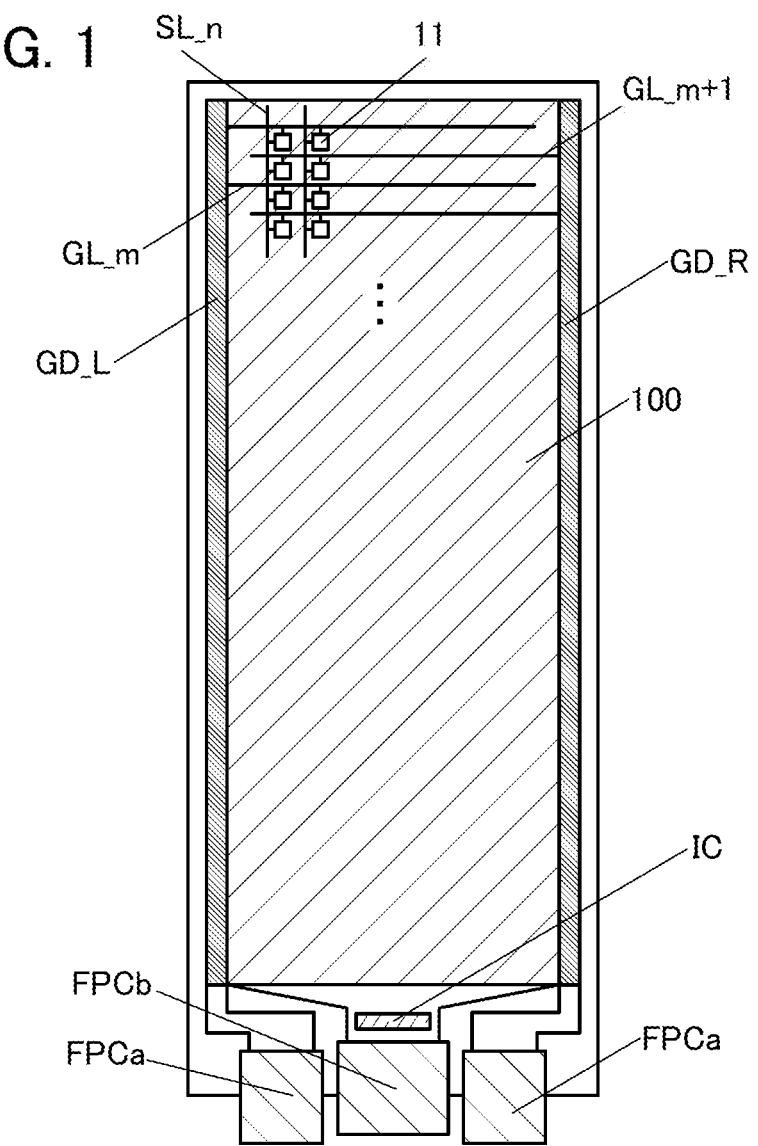
FIG. 1 A drawing illustrating an example of the structure of a display module.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Thus, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, display devices of one embodiment of the present invention will be described with reference to FIGS. 1 to 7.

<Top-View Layout of Display Module>

FIG. 1 shows a top view of a display module.

The display module shown in FIG. 1 includes a display device, an integrated circuit (IC) connected to the display device, and flexible printed circuit boards (FPCa and FPCb).

The display device includes a display region 100, a gate driver GD_L, and a gate driver GD_R.

The display region 100 includes a plurality of pixels 11 and has a function of displaying images.

The pixel 11 can also be referred to as a subpixel. A full-color image can be displayed in the display region 100 when one pixel unit is composed of a subpixel exhibiting a red color, a subpixel exhibiting a green color, and a subpixel exhibiting a blue color, for example. Note that the colors exhibited by subpixels are not limited to red, green, and blue. For example, a subpixel exhibiting a color such as white, yellow, magenta, or cyan may be used for the pixel unit. Note that in this specification and the like, a subpixel is simply referred to as a pixel in some cases.

The display device may incorporate one or more of a scan line driver circuit (a gate driver), a signal line driver circuit (a source driver), and a driver circuit for a touch sensor. One or more of these may be externally attached. The display device shown in FIG. 1 incorporates gate drivers, and an integrated circuit IC including a source driver is externally attached to the display device.

One of the gate driver GD_L and the gate driver GD_R has a function of controlling the pixels in the odd-numbered rows and the other has a function of controlling the pixels in even-numbered rows. For example, the pixels in an m-th row are connected to a scan line GL_m and controlled by the gate driver GD_L. The pixels in an (m+1)-th row are connected to a scan line GL_m+1 and controlled by the gate driver GD_R. A signal line SL_n in an n-th column is alternately connected to the pixel 11 electrically connected to the gate driver GD_L and the pixel 11 electrically connected to the gate driver GD_R. The pitch of wirings connected to one gate driver can be widened by separately providing the gate drivers on two opposite sides. In the case where the gate driver is provided only on one side, a non-display region on the side is wider. Thus, the gate drivers are provided separately on two sides of the display device, whereby a non-display region of the display device can be made smaller and the bezel can be narrowed.

Signals and power are supplied from the outside to the gate driver GD_L and the gate driver GD_R through the flexible printed circuit board FPCa. Signals and power are supplied from the outside to the integrated circuit IC through the flexible printed circuit board FPCb.

Figure 2A:
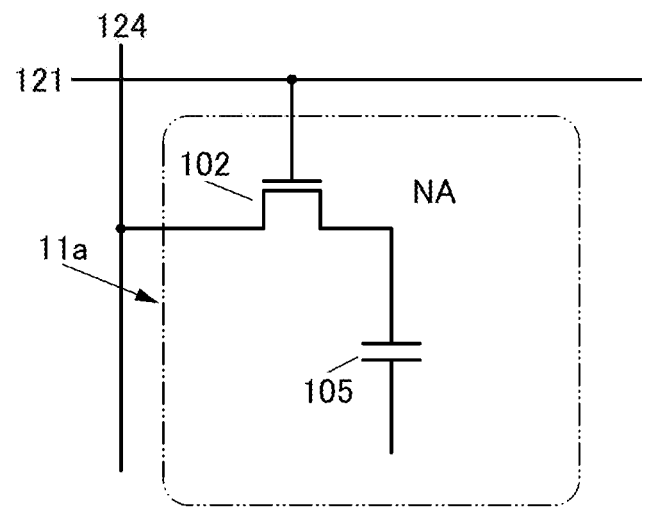
FIG. 2 (A) is a circuit diagram illustrating an example of the structure of a pixel. (B) is a cross-sectional view illustrating an example of the structure of a pixel.

An example of a circuit configuration that the pixel 11 has is described with reference to FIG. 2(A). A pixel 11a shown in FIG. 2(A) includes a transistor 102 and a capacitor 105.

The one of a source and a drain of the transistor 102 is electrically connected to one electrode of the capacitor 105.

It is preferable that a display element be electrically connected in parallel or in series to the capacitor 105. Examples of the display element include a liquid crystal element, an organic EL element, an LED element, and a MEMS (Micro Electro Mechanical Systems) element.

Here, a node at which the one of the source and the drain of the transistor 102 and the one electrode of the capacitor 105 are connected is referred to as a node NA.

A gate of the transistor 102 is electrically connected to a wiring 121. The other of the source and the drain of the transistor 102 is electrically connected to a wiring 124.

The wiring 121 can be referred to as a scan line and has a function of controlling the operation of the transistor. The wiring 124 has a function of a signal line that supplies an image signal.

The use of a transistor with extremely low off-state current as the transistor 102 enables long-term retention of the potential of the node NA. As the transistor, a transistor using a metal oxide in a channel formation region (hereinafter, OS transistor) can be used, for example.

A transistor containing silicon in a channel formation region (hereinafter, Si transistor) may also be used as the transistor included in the pixel. Examples of the Si transistor include a transistor containing amorphous silicon and a transistor containing crystalline silicon (typically, low-temperature polysilicon or single crystal silicon).

In the case where an image signal is rewritten every frame period, for example, an OS transistor or a Si transistor may be used. In the case where the potential of the node NA needs to be retained for a long period of time, an OS transistor, rather than a Si transistor, is preferably used.

<Top-View Layout of Pixel>

Examples of the transistor 102 and the capacitor 105 included in the pixel 11a will be described with reference to FIG. 2(B) and FIG. 3.

Figure 2B:
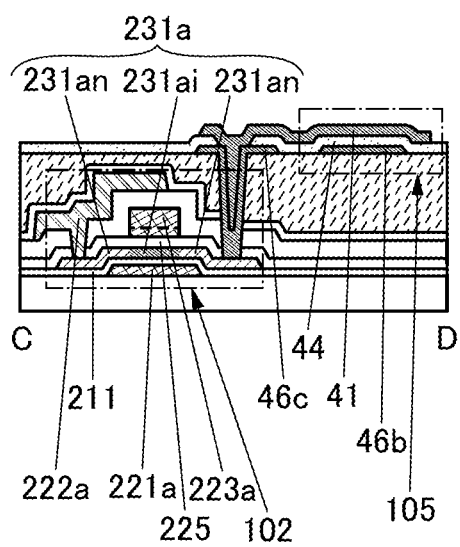
Figure 3A:
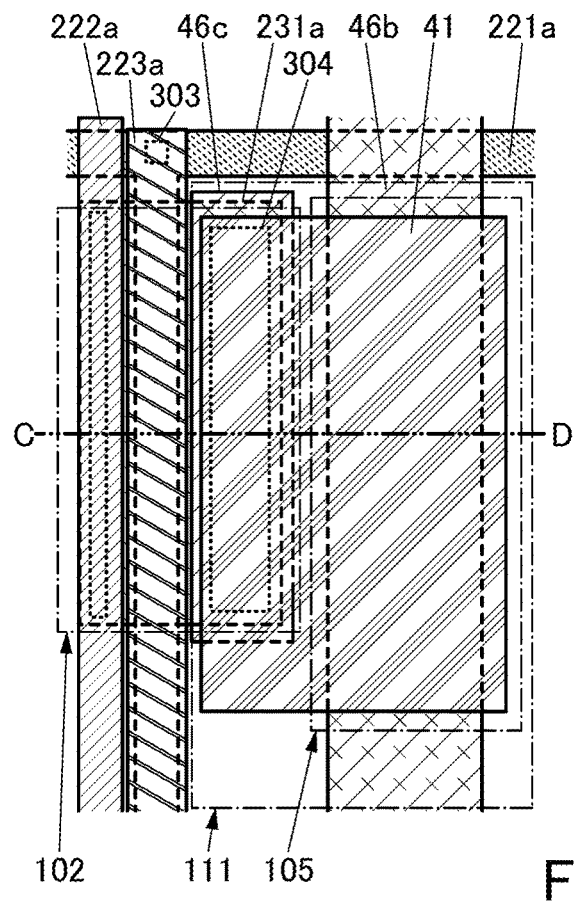
FIG. 3 (A) is a top view illustrating an example of the structure of a pixel. (B) is a top view illustrating an example of the structure of a pixel. (C) is a top view illustrating an example of the structure of a pixel. (D) is a top view illustrating an example of the structure of a pixel.

FIG. 3(A) illustrates an example of a top view of the transistor 102 and the capacitor 105. FIG. 2(B) illustrates a cross section taken along dashed double-dotted line C-D in FIG. 3(A). The capacitor 105 is electrically connected to the transistor 102 through a conductive layer 41 and the like.

The transistor 102 includes a semiconductor layer 231a, a conductive layer 223a, a conductive layer 221a, a conductive layer 222a, and a conductive layer 46c. The capacitor 105 includes a conductive layer 46b, a conductive layer 41, and an insulating layer 44 sandwiched between the two conductive layers. The conductive layer 223a and the conductive layer 221a preferably function as gate electrodes. The conductive layer 223a is placed to overlap with the semiconductor layer 231a with an insulating layer 225 functioning as a gate insulating film sandwiched therebetween, and the conductive layer 221a is placed to overlap with the semiconductor layer 231a with an insulating layer 211 functioning as a gate insulating film sandwiched therebetween. The conductive layer 223a and the conductive layer 221a may be electrically connected to each other through an opening portion 303 provided in a layer sandwiched between the conductive layer 223a and the conductive layer 221a.

In FIG. 3(A), the conductive layer 223a and the conductive layer 221a are electrically connected to each other through the opening portion 303, and the conductive layer 221a is used as a wiring extending to other regions, for example, an adjacent pixel or the like. The conductive layer 223a, instead of the conductive layer 221a, may be used as a wiring. Seen from above, for example, the conductive layer 221a includes a region intersecting with the conductive layer 222a. When the conductive layer 221a is used as the wiring, a plurality of insulating layers can be placed between the conductive layer 222a and the conductive layer 221a to increase the physical distance between the conductive layers, which brings advantages such as less short-circuiting and a smaller parasitic capacitance.

The conductive layer 222a is placed over the semiconductor layer 231a with an insulating layer provided therebetween. Specifically, the conductive layer 222a is placed over a low-resistance region of the semiconductor layer 231a. An opening portion 301 is provided in the insulating layer. It is preferable that the conductive layer 222a be electrically connected to the semiconductor layer 231a through the opening portion 301. It is also preferable that the conductive layer 222a be provided so as to fill the opening portion 301. The semiconductor layer 231a includes a region 231ai which is a region overlapping with the conductive layer 223a and two low-resistance regions 231an. The two low-resistance regions 231an are placed with the conductive layer 223a sandwiched therebetween, when seen from above. It is preferable that the region 231ai function as a channel formation region. It is preferable that one of the two low-resistance regions 231an function as a source region and the other function as a drain region. The low-resistance regions of the semiconductor layer contain an impurity element such as hydrogen, boron, carbon, nitrogen, fluorine, phosphorus, sulfur, arsenic, aluminum, or a rare gas, for example. In particular, boron or phosphorus is preferably contained. Two or more of these elements may be contained.

The conductive layer 41 is placed over the conductive layer 46b and the conductive layer 46c, with an insulating layer provided therebetween. An opening portion 304 is provided in the insulating layer in a region overlapping with the conductive layer 46c. It is preferable that the conductive layer 41 be electrically connected to the conductive layer 46c through the opening portion 304. The conductive layer 41 is provided so as to cover an opening portion 302.

Figure 3B:
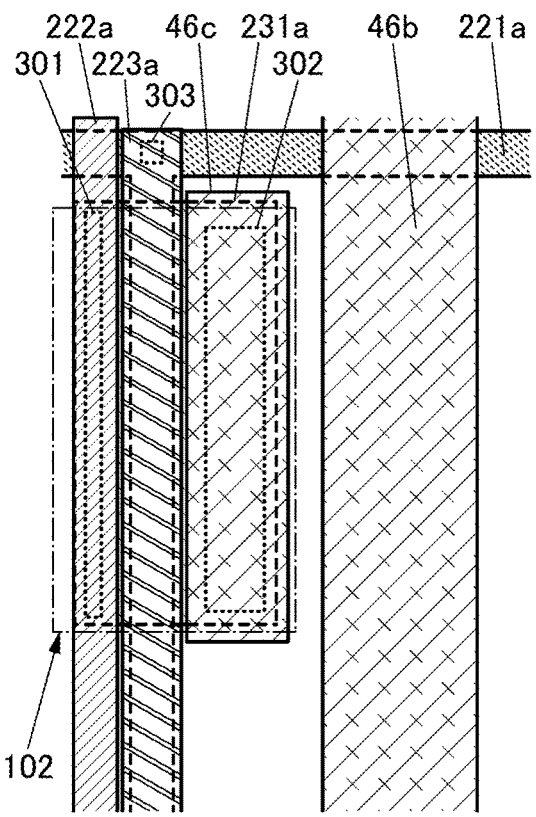
Figure 3C:
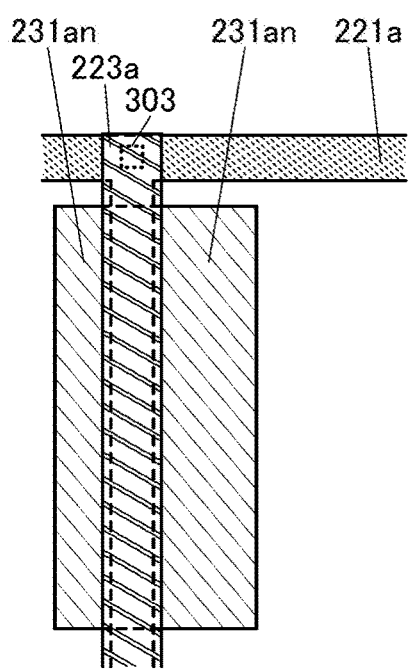

FIG. 3(B) is a top view without the conductive layer 41, which is shown in FIG. 3(A), for the easiness of viewing. FIG. 3(C) is a top view without the conductive layer 222a, the conductive layer 46c, the conductive layer 46b, the opening portion 301, the opening portion 302, and the like. The conductive layer 46c is placed over the semiconductor layer 231a with an insulating layer provided therebetween. Specifically, the conductive layer 46c is placed over the low-resistance region 231an of the semiconductor layer 231a. The opening portion 302 is provided in the insulating layer. It is preferable that the conductive layer 46c be electrically connected to the semiconductor layer 231a through the opening portion 302. The conductive layer 46c is placed so as to cover the inside of the opening portion 302.

The conductive layer 222a is electrically connected to the one of the source and the drain of the transistor 102, and the conductive layer 46c is electrically connected to the other of the source and the drain of the transistor 102.

When an OS transistor is used as the transistor 102, the semiconductor layer 231a can have a function of transmitting visible light. When the semiconductor layer 231a or the like contains an impurity element, the semiconductor layer can be reduced in resistance while keeping a function of transmitting visible light.

It is preferable to use materials that transmit visible light for the semiconductor layer 231a, the conductive layer 46c, the conductive layer 46b, and the conductive layer 41. Formation of the transistor 102 and the capacitor 105 over a substrate that transmits visible light enables a region 111 shown in FIG. 3(A) to have a function of transmitting visible light. The use of the structure of one embodiment of the present invention can increase the area of the region 111 seen from above. Thus, the aperture ratio of the pixel can be improved. An improved aperture ratio can increase the light extraction efficiency (or the transmittance of the pixel). In this way, the power consumption of the display device can be reduced. In addition, the display quality of the display device can be increased.

Figure 3D:
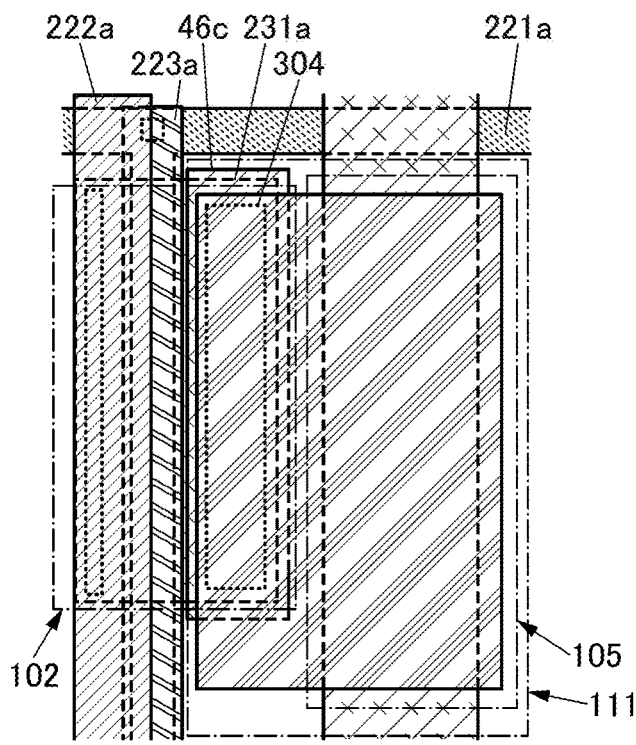

In the transistor 102 illustrated in FIG. 3(A), one of wirings to be electrically connected to the source and the drain can be the conductive layer 222a and the other can be the conductive layer 46c, and these conductive layers are formed in different layers with insulating layers provided therebetween, as shown by the cross section in FIG. 2(B). Compared to the case where the conductive layers are formed in the same layer, the distance between the conductive layers seen from above can be smaller in some cases. For example, as illustrated in FIG. 3(D), when the conductive layer 222a has a region overlapping with the conductive layer 223a, seen from above, the wiring width of the conductive layer 222a can be made greater. A greater wiring width can reduce the wiring resistance and improve the performance of the display device, for example.

When the channel width of the transistor 102 is increased, the current drive capability of the transistor 102 is improved and the charging rate of the capacitor 105 is increased. On the other hand, a greater channel width of the transistor 102 increases the area occupied by the transistor 102 in the pixel, which leads to a lower aperture ratio in some cases. Here, a channel width refers to the width of a channel formation region, for example.

The use of the structure of one embodiment of the present invention can achieve a higher aperture ratio with a great channel width of the transistor 102, in some cases.

The use of the structure of one embodiment of the present invention can increase the capacity. Thus, even when a liquid crystal material with a high dielectric constant is used, superior response speed can be achieved.

Figure 4:
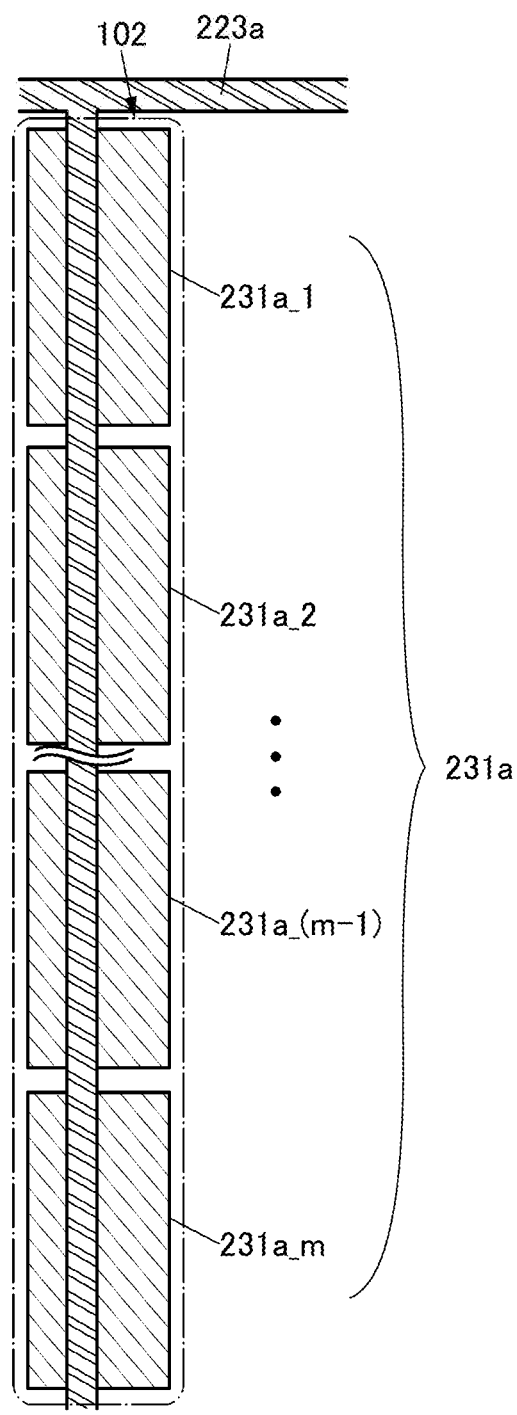
FIG. 4 A top view illustrating an example of the structure of a transistor.

The semiconductor layer included in the transistor may be composed of a plurality of island-shaped semiconductor layers. FIG. 4 illustrates an example in which the semiconductor layer 231a included in the transistor 102 is composed of a plurality of island-shaped semiconductor layers. The semiconductor layer 231a in FIG. 4 is composed of m (here, m is an integer of 2 to 50 inclusive, preferably 3 to 20 inclusive, and further preferably 3 to 10 inclusive) island-shaped semiconductor layers 231a_1 to 231a_m. When composed of a plurality of island-shaped semiconductor layers, the semiconductor layer 231a can release heat more easily in some cases. Thus, the temperature rise in the transistor during operation can be suppressed in some cases. This improves the reliability of the transistor in some cases.

The channel width of the transistor 102 is, for example, the width of a region of the semiconductor layer included in the transistor 102, which overlaps with the gate electrode, in a direction roughly vertical to the source region-to-drain region direction seen from above.

In the case where the transistor 102 includes a plurality of island-shaped semiconductor layers, the channel width of the transistor 102 is, for example, the sum of the widths of the island-shaped semiconductor layers. The width of each island-shaped semiconductor layer is, for example, 2 μm to 300 μm inclusive, 3 μm to 200 μm inclusive, 5 μm to 100 μm inclusive, or 10 μm to 50 μm inclusive. The width of each island-shaped semiconductor layer is, for example, smaller than 100 times, preferably smaller than 50 times, and further preferably smaller than 25 times the channel length of the transistor 102.

The channel width in the case where the structure illustrated in FIG. 4 is used as the transistor 102 is, for example, 30 μm to 1000 μm inclusive, 30 μm to 500 μm inclusive, or 50 μm to 350 μm inclusive.

<Structure Example of Display Device>

Structure examples of a display device including two transistors and two capacitors in a pixel are described with reference to FIGS. 5(A), 5(B), 5(C), FIG. 6, and FIGS. 7(A) and 7(B).

The display device of one embodiment of the present invention has a function of adding a correction signal to an image signal.

The correction signal is added to an image signal by capacitive coupling, and is supplied to a liquid crystal element. Thus, the liquid crystal element can display a corrected image. Through this correction, the liquid crystal element can express greater gray levels than those that can be expressed by use of only image signals, for example.

Owing to the correction, the liquid crystal element can be driven at a voltage higher than the output voltage of a source driver. A voltage supplied to the liquid crystal element can be changed to a desired value in the pixel; therefore, an existing source driver can be used and the cost for designing a novel source driver can be reduced. Furthermore, an increase in output voltage of the source driver can be suppressed, so that power consumption of the source driver can be reduced.

When a liquid crystal element is driven with application of high voltage, the display device can be used in a wide temperature range, and highly reliable display can be performed in both low temperature environment and high temperature environment. For example, the display device can be used as a display device for a vehicle or a camera.

Furthermore, a liquid crystal element can be driven with application of high voltage; therefore, a liquid crystal material having a high driving voltage such as a liquid crystal material exhibiting a blue phase can be used, and the range of choices of a liquid crystal material can be widened.

Furthermore, a liquid crystal element can be driven with application of high voltage; thus, the response speed of the liquid crystal can be increased by overdriving in which a voltage applied to the liquid crystal element is increased temporarily so that the alignment of the liquid crystal is rapidly changed.

The correction signal is generated in an external device and written to the pixel, for example. The correction signal may be generated in real time using an external device, or a correction signal stored in a storage medium may be read and synchronized with the image signal.

In the display device of one embodiment of the present invention, an image signal supplied thereto is not changed, and a new image signal can be generated in a pixel to which a correction signal is supplied. As compared with the case where a new image signal itself is generated using an external device, load on an external device can be reduced. Furthermore, the operation for generating a new image signal in a pixel can be performed in a small number of steps and thus can be performed even in a display device with a large number of pixels and a short horizontal period.

<Circuit>

Figure 5A:
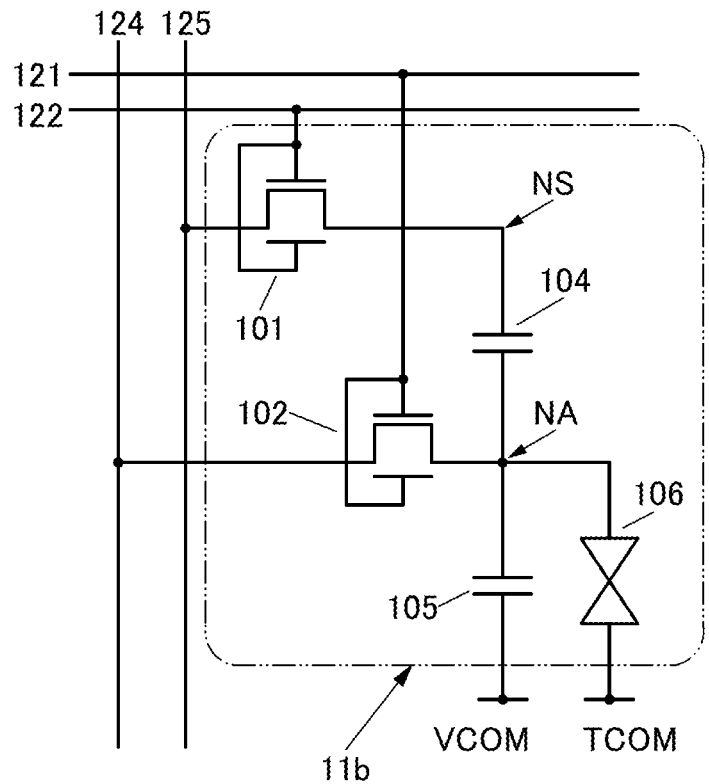
FIG. 5 (A) is a circuit diagram illustrating an example of the structure of a pixel. (B) is a timing chart for describing the operation. (C) is a timing chart for describing the operation.

FIG. 5(A) shows a circuit diagram of a pixel 11b.

The pixel 11b includes the transistor 101, the transistor 102, the capacitor 104, the capacitor 105, and the liquid crystal element 106.

The one of the source and the drain of the transistor 101 is electrically connected to one electrode of the capacitor 104. The other electrode of the capacitor 104 is electrically connected to one of a source and a drain of the transistor 102, one electrode of the capacitor 105, and one electrode of the liquid crystal element 106.

Here, a node at which the one of the source and the drain of the transistor 101 and the one electrode of the capacitor 104 are connected is referred to as a node NS. A node at which the other electrode of the capacitor 104, the one of the source and the drain of the transistor 102, the one electrode of the capacitor 105, and the one electrode of the liquid crystal element 106 are connected is referred to as a node NA.

A gate of the transistor 101 is electrically connected to a wiring 122. A gate of the transistor 102 is electrically connected to the wiring 121. The other of the source and the drain of the transistor 101 is electrically connected to a wiring 125. The other of the source and the drain of the transistor 102 is electrically connected to the wiring 124.

The other electrode of the capacitor 105 and the other electrode of the liquid crystal element 106 are electrically connected to a common wiring VCOM and a common wiring TCOM, respectively. A given potential can be supplied to each of the common wiring VCOM and the common wiring TCOM.

The wiring 121 and the wiring 122 can each be referred to as a scan line, and have a function of controlling the operation of the transistor. The wiring 125 can function as a signal line for supplying an image signal. The wiring 124 can function as a signal line for writing data into the node NA.

The transistors illustrated in FIG. 5(A) each include a back gate electrically connected to its gate; however, the connection of the back gate is not limited thereto. The back gate is not necessarily provided in the transistor.

When the transistor 101 is turned off, the potential of the node NS can be retained. Furthermore, when the transistor 102 is turned off, the potential of the node NA can be retained. When a predetermined potential is supplied to the node NS through the transistor 101 with the transistor 102 being in an off state, the potential of the node NA can be changed in accordance with a change of the potential of the node NS owing to capacitive coupling through the capacitor 104.

In the pixel 11b, the correction signal written from the wiring 124 to the node NA is coupled with the image signal supplied from the wiring 125 and is supplied to the liquid crystal element 106. Thus, the liquid crystal element 106 can display a corrected image.

The use of a transistor with a noticeably low off-state current as the transistor 101 allows the potential at the node NS to be retained for a long time. As such a transistor, an OS transistor can be used, for example. Similarly, the use of a transistor with extremely low off-state current as the transistor 102 enables long-term retention of the potential of the node NA. An OS transistor can be given as an example of a transistor having an extremely low off-state current. A Si transistor may also be used as the transistor included in the pixel. Alternatively, both an OS transistor and a Si transistor may be used.

A Si transistor may be used as the transistor included in the pixel. Examples of the Si transistor include a transistor containing amorphous silicon and a transistor containing crystalline silicon (typically, low-temperature polysilicon or single crystal silicon).

For example, in the case where a correction signal and an image signal are rewritten every frame period, an OS transistor or a Si transistor may be used as each of the transistor 101 and the transistor 102. In the case where the potential of the node NS or the node NA needs to be retained for a long time, an OS transistor, rather than a Si transistor, is preferably used as the transistor 101 and the transistor 102.

<Timing Chart>

Figure 5B:
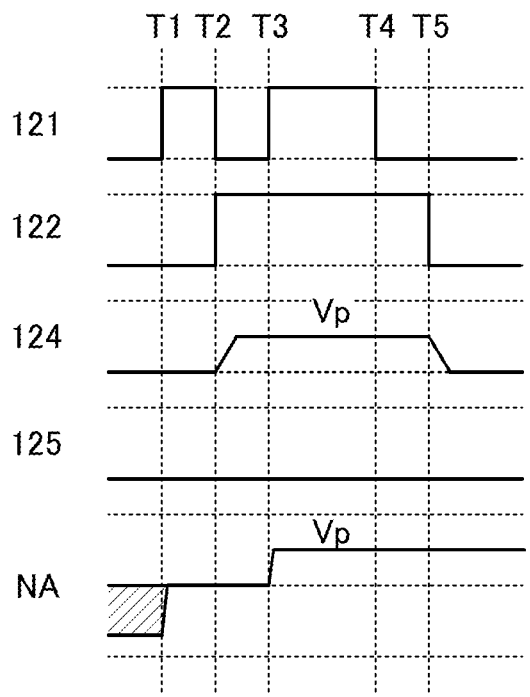

The operation of writing a correction signal (Vp) into the node NA in the pixel 11b is described with reference to the timing chart in FIG. 5(B). To correct an image signal (Vs), the correction signal Vp is preferably written every frame period. Note that although a given positive or negative signal can be used as a correction signal (Vp) supplied to the wiring 124, the case where a positive signal is supplied is described here. In the following description, a high potential is represented by "H", and a low potential is represented by "L".

At time T1, the potential of the wiring 121 is set to "H", the potential of the wiring 122 is set to "L", the potential of the wiring 124 is set to "L", and the potential of the wiring 125 is set to "H", so that the transistor 102 is turned on and the potential of the node NA becomes the potential of the wiring 124. At this time, the potential of the wiring 124 is set to a reset potential (e.g., "L"), whereby the operation of the liquid crystal element 106 can be reset.

Note that before Time T1, the display operation of the liquid crystal element 106 in the previous frame period is performed.

At time T2, the potential of the wiring 121 is set to "L", the potential of the wiring 122 is set to "H", the potential of the wiring 124 is set to "Vp", and the potential of the wiring 125 is set to "L", so that the transistor 101 is turned on and the potential of the one electrode of the capacitor 104 becomes "L". The operation is a reset operation for capacitive coupling operation that is to be performed later.

At time T3, the potential of the wiring 121 is set to "H", the potential of the wiring 122 is set to "H", the potential of the wiring 124 is set to "Vp", and the potential of the wiring 125 is set to "L", so that the potential (correction signal (Vp)) of the wiring 124 is written to the node NA.

At time T4, the potential of the wiring 121 is set to "L", the potential of the wiring 122 is set to "H", the potential of the wiring 124 is set to "Vp", and the potential of the wiring 125 is set to "L", so that the transistor 102 is turned off and the correction signal (Vp) is retained in the node NA.

At time T5, the potential of the wiring 121 is set to "L", the potential of the wiring 122 is set to "L", and the potential of the wiring 125 is set to "L", so that the transistor 101 is turned off; thus, the operation of writing the correction signal (Vp) is completed.

Figure 5C:
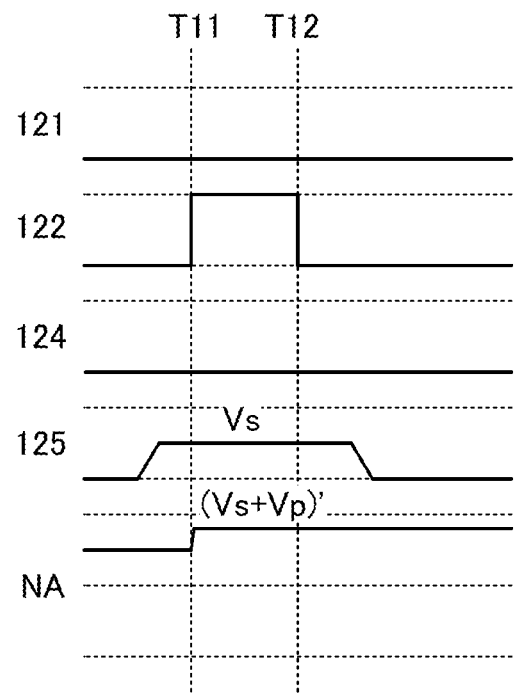

Next, the operation of correcting the image signal (Vs) in the pixel 11b and the display operation of the liquid crystal element 106 are described with reference to a timing chart in FIG. 5(C). Note that an intended potential is supplied to the wiring 125 at an appropriate timing.

At time T11, the potential of the wiring 121 is set to "L", the potential of the wiring 122 is set to "H", and the potential of the wiring 124 is set to "L", so that the transistor 101 is turned on and the potential of the wiring 125 is added to the potential of the node NA by capacitive coupling of the capacitor 104. That is, the potential of the node NA becomes a potential (Vs+Vp)' obtained by adding the correction signal (Vp) to the image signal (Vs). Note that the potential (Vs+Vp)' includes a potential variation due to capacitive coupling between wirings, for example.

At time T12, the potential of the wiring 121 is set to "L", the potential of the wiring 122 is set to "L", and the potential of the wiring 124 is set to "L", so that the transistor 101 is turned off and the potential (Vs+Vp)' is retained in the node NA. Then, the display operation based on the potential is performed by the liquid crystal element 106.

The above is the description of the operation of correcting the image signal (Vs) and the display operation of the liquid crystal element 106. Note that the operation of writing the correction signal (Vp) described above and an operation of inputting the image signal (Vs) may be successively performed but the operation of inputting the image signal (Vs) is preferably performed after the correction signal (Vp) is written to all the pixels.

Note that when the correction operation is not performed, the display operation with the liquid crystal element 106 may be performed by supplying an image signal to the wiring 124 and controlling the on and off of the transistor 102. At this time, the transistor 101 may be always off or may be always on while a constant potential is supplied to the wiring 125.

Figure 6:
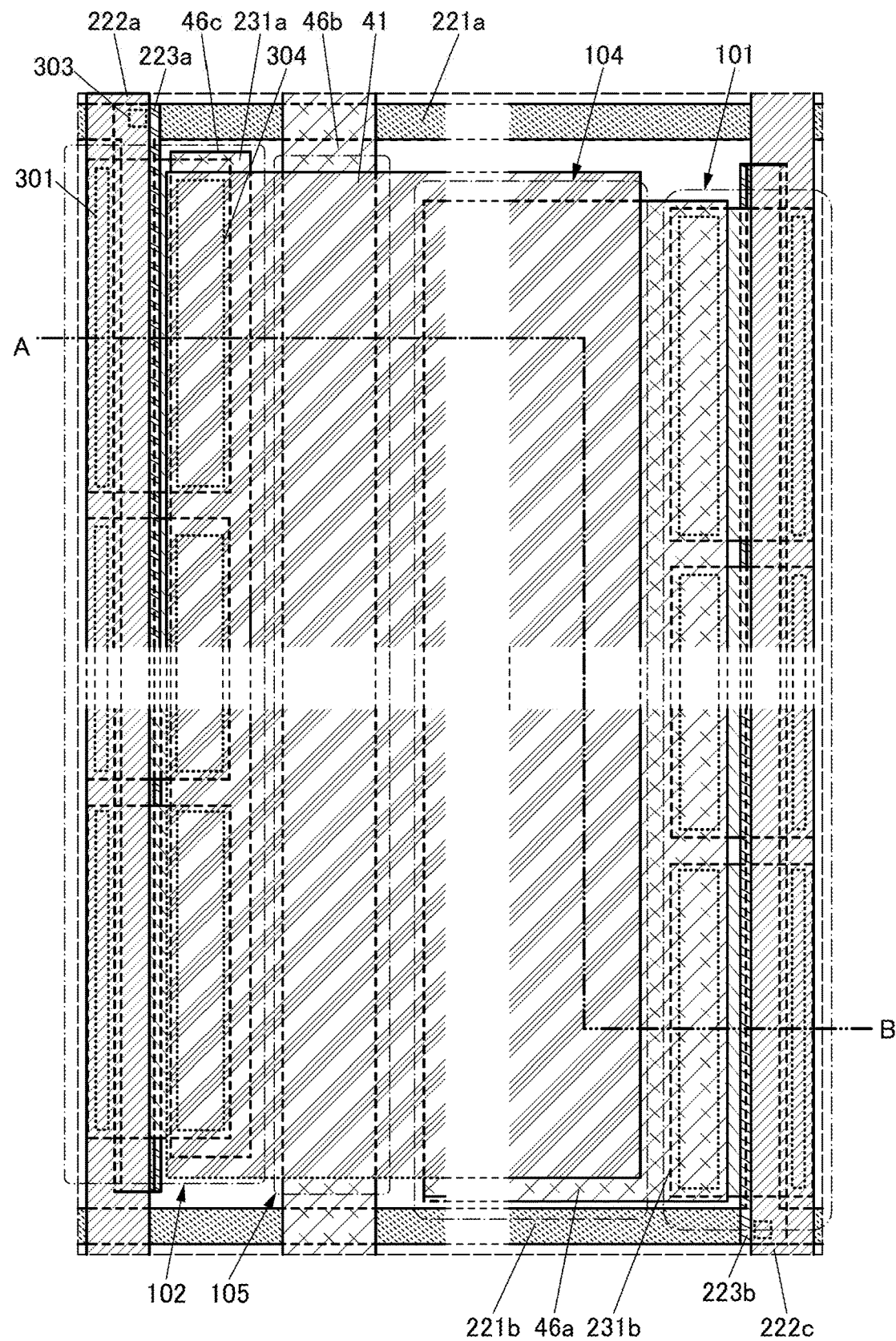
FIG. 6 A top view illustrating an example of the structure of a pixel.

FIG. 6 is an example of the top view of the pixel 11b.

When an OS transistor is used as each of the transistor 101 and the transistor 102, the semiconductor layer 231a and a semiconductor layer 231b can have a function of transmitting visible light.

In FIG. 6, the conductive layer 222a included in the transistor 102 has a region overlapping with the conductive layer 223a.

The transistor 101 illustrated in FIG. 6 includes the semiconductor layer 231b, a conductive layer 223b, a conductive layer 221b, and a conductive layer 222c. The capacitor 104 can be composed of a conductive layer 46a, the conductive layer 41, and the insulating layer 44 sandwiched between the two conductive layers. The conductive layer 41 is a common electrode in the capacitor 105 and the capacitor 104.

In the pixel of one embodiment of the present invention, the capacitor 104 preferably has a larger capacitance value than the capacitor 105. The area of a region where the conductive layer 41 and the conductive layer 46a overlap with each other is preferably larger than the area of a region where the conductive layer 41 and the conductive layer 46b overlap with each other, for example.

In addition, a capacitor is also formed by two electrodes, i.e., the conductive layer 41 and a conductive layer 43c which will be described later with reference to FIG. 7 or the like.

The conductive layer 223b and the conductive layer 221b each preferably function as a gate electrode. The conductive layer 223b and the conductive layer 221b may be electrically connected to each other through an opening portion provided in a layer sandwiched therebetween.

The conductive layer 222c is placed over the semiconductor layer 231b with an insulating layer provided therebetween. Specifically, the conductive layer 222c is placed over a low-resistance region of the semiconductor layer 231b. It is preferable that the conductive layer 222c be electrically connected to the semiconductor layer 231b through an opening portion provided in the insulating layer.

It is preferable that the conductive layer 46a be electrically connected to the semiconductor layer 231b. The conductive layer 222c and the conductive layer 46a are electrically connected to either one of the source and the drain of the transistor 101.

The conductive layer 46a and the semiconductor layer 231b each preferably have a function of transmitting visible light.

Here, the conductive layer 46a, the conductive layer 46b, the conductive layer 46c, and the conductive layer 41 transmit visible light more easily than the semiconductor layer 231a and the semiconductor layer 231b do. The expression "transmit visible light more easily" means that the transmittance of visible light is higher, for example. In addition, the channel formation regions included in the semiconductor layer 231a and the semiconductor layer 231b (e.g., the region 231ai) transmit visible light more easily than the low-resistance regions included in the semiconductor layer 231a and the semiconductor layer 231b (e.g., the low-resistance regions 231an) do in some cases.

Figure 7A:
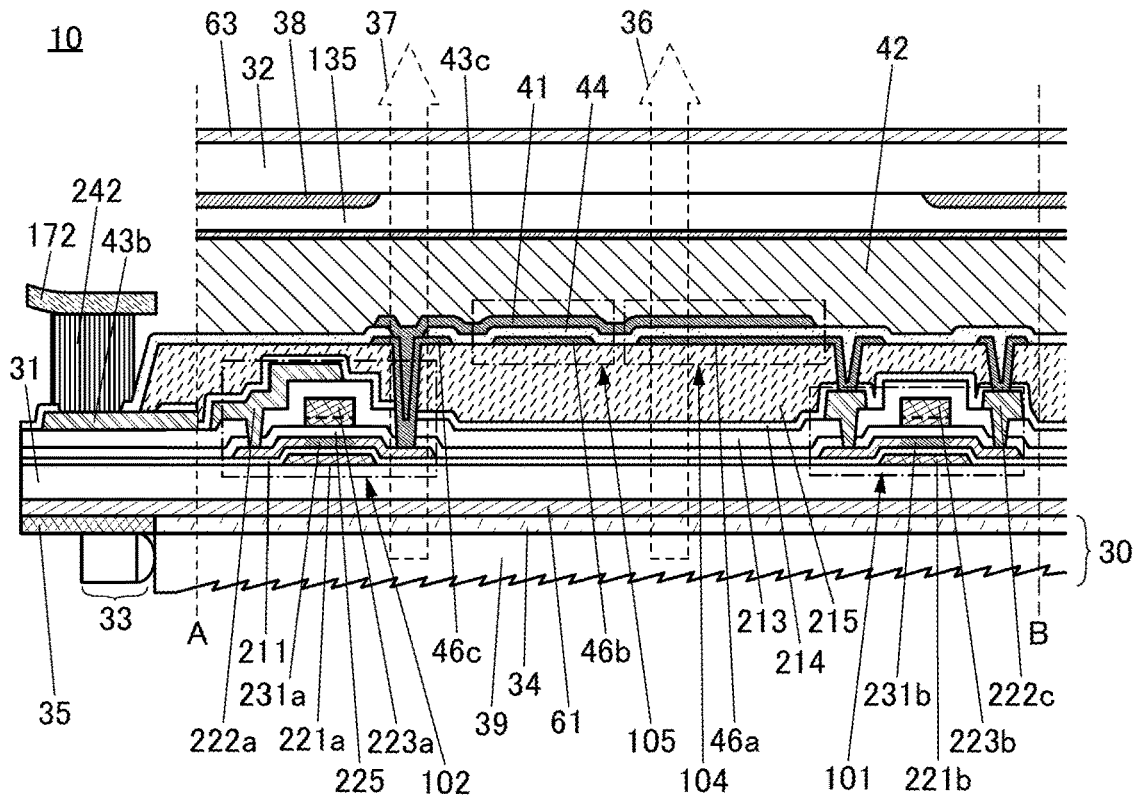
FIG. 7 (A) is a cross-sectional view illustrating an example of the structure of a pixel. (B) is a cross-sectional view illustrating an example of the structure of a pixel.

FIG. 7(A) illustrates an example of a cross section of a display device 10 including the pixel of one embodiment of the present invention. The cross section A-B is a cross section taken along dashed double-dotted line A-B in FIG. 6.

The display device 10 shown in FIG. 7(A) includes a substrate 31, the transistor 101 and the transistor 102 provided over the substrate 31, an insulating layer 213 provided over the transistors, an insulating layer 214 provided over the insulating layer 213, and an insulating layer 215 provided over the insulating layer 214. The display device 10 also includes an FPC 172, a connector 242, and a conductive layer 43b, which are provided over the substrate. In the example shown in FIG. 7(A), the FPC 172 is electrically connected to the conductive layer 43b through the connector 242. The conductive layer 43b is preferably formed of the same layer as the conductive layer 222a or the like.

The display device 10 shown in FIG. 7(A) includes a substrate 32 that is placed so as to face the substrate 31. On the surface of the substrate 32 that faces the substrate 31, a light-blocking layer 38, an overcoat 135, and the conductive layer 43c are provided in this order.

A liquid crystal layer 42 is sandwiched between the substrate 31 and the substrate 32. More specifically, the liquid crystal layer 42 is sandwiched between the conductive layer 43c and the conductive layer 41 or the like, for example.

The display device 10 may include a spacer, an alignment film, a coloring layer, and the like.

The display device 10 shown in FIG. 7(A) includes a polarizing plate 61, a polarizing plate 63, and a backlight unit 30. The backlight unit 30 includes a light-emitting element 33, a diffusion plate 34, and a light guide plate 39. The light-emitting element 33 may be provided with a light diffusion lens if necessary. Although FIG. 7(A) shows a structure including the polarizing plate 61 and the polarizing plate 63, the display device 10 may have a structure without both or either one of the polarizing plate 61 and the polarizing plate 63.

The insulating layer 211 and the insulating layer 225 which are in contact with the semiconductor layer 231a and the semiconductor layer 231b are preferably oxide insulating layers. Note that in the case where the insulating layer 211 or the insulating layer 225 has a stacked-layer structure, at least a layer in contact with the semiconductor layer 231a and the like is preferably an oxide insulating layer. Thus, generation of oxygen vacancies in the semiconductor layer 231a and the like can be suppressed, and thus, the reliability of the transistor can be improved.

Either of the insulating layer 213 and the insulating layer 214 is preferably a nitride insulating layer. Thus, entry of impurities into the semiconductor layer 231a and the like can be suppressed, which can increase the reliability of the transistor in some cases.

The insulating layer 215 preferably has a planarization function, and is preferably an organic insulating layer, for example. Note that the insulating layer 215 need not necessarily be formed, and the conductive layer 46a or the like may be formed over and in contact with the insulating layer 214.

The insulating layer 211, the insulating layer 225, the insulating layer 213, the insulating layer 214, and the insulating layer 215 each preferably have a function of transmitting visible light.

The substrate 31 and the substrate 32 each preferably have a function of transmitting visible light. There is no particular limitation on the material and the like of the substrate 31 and the substrate 32; various substrates can be used. For example, a glass substrate, a quartz substrate, a sapphire substrate, a semiconductor substrate, a ceramic substrate, a metal substrate, a plastic substrate, or the like can be used.

The use of a thin substrate can reduce the weight and thickness of the display device. Furthermore, the use of a substrate that is thin enough to have flexibility allows a flexible display device to be obtained.

The backlight unit 30 illustrated in FIG. 7(A) has a structure in which the light guide plate 39 is provided directly under a pixel with the diffusing plate 34 positioned therebetween. The light-emitting element 33 is provided at an end portion of the light guide plate 39. The light guide plate 39 has an uneven shape on the surface opposite to the diffusing plate 34, and can scatter wave-guided light with the uneven shape to emit the light in the direction of the diffusing plate 34.

The light-emitting element 33 has a function of emitting visible light.

The light emitted in the direction of the diffusion plate 34 is emitted to the substrate 32 side through paths such as a path 36 and a path 37 illustrated in FIG. 7(A).

In the path 36, light entering from the substrate 31 side is emitted to the substrate 32 side through the insulating layer 211, the insulating layer 225, the insulating layer 213, the insulating layer 214, the insulating layer 215, the conductive layer 46a, the insulating layer 44, the conductive layer 41, the liquid crystal layer 42, the conductive layer 43c, and the overcoat 135.

In the path 37, light entering from the substrate 31 side is emitted to the substrate 32 side through the insulating layer 211, the low-resistance region of the semiconductor layer 231a, the conductive layer 46c, the conductive layer 41, the liquid crystal layer 42, the conductive layer 43c, and the overcoat 135.

The light-emitting element 33 can be fixed to a printed board 35. In the light-emitting element 33, light-emitting elements of RGB colors are arranged, for example.

The display device 10 can display a color image.

In the case where the display device 10 includes a coloring layer, light emitted from the light source of the backlight unit 30, excluding light in a particular wavelength range, is absorbed by the coloring layer. Thus, for example, light emitted from the red pixel (subpixel) to the outside of the display module is red, light emitted from the green subpixel (subpixel) to the outside of the display module is green, and light emitted from the blue subpixel (subpixel) to the outside of the display module is blue.

The backlight unit 30 can have a structure in which light-emitting elements for three colors sequentially flash light. The display device 10 can make the light-emitting elements for the three colors flash light sequentially, drive the pixels in synchronization with these light-emitting elements, and perform color display on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, the pixels do not need to be provided with color filters, and thus can have improved transmittance and achieve brighter image display. In addition, the manufacturing process can be simplified, and the manufacturing costs can be reduced.

A field-sequential driving method performs color display by time division. Specifically, light-emitting elements of red, green, blue, and the like are sequentially emitted at different timings, and the pixels are driven in synchronization with the above, so that, color display is performed on the basis of a successive additive color mixing method.

In the case where a field-sequential driving method is employed, one pixel does not need to include subpixels of different colors; thus, the aperture ratio of a pixel can be increased. Moreover, the resolution of the display device can be increased. In addition, since a coloring layer such as a color filter does not need to be provided, light is not absorbed by the coloring layer, so that the transmittance of a pixel can be improved. Accordingly, required luminance can be obtained with low power; thus, low power consumption is possible. Furthermore, the manufacturing process of the display device can be simplified and the manufacturing cost can be reduced.

In the case where a field-sequential driving method is employed, a high frame frequency is required. Since the display device of one embodiment of the present invention includes two capacitors in one pixel, the storage capacity of the pixel can be increased and a high voltage can be supplied to a liquid crystal element; thus, the response speed of the liquid crystal element can be increased. For example, the response speed of the liquid crystal element can be improved by overdriving in which a voltage applied to a liquid crystal element is temporarily increased so that the alignment of liquid crystals is changed rapidly. Therefore, it can be said that the display device of one embodiment of the present invention is suitable in application of a field-sequential driving method in which a high frame frequency is required.

The rotational viscosity coefficient of the liquid crystal material is preferably low because the response of the liquid crystal element can be quick. Specifically, the rotational viscosity coefficient of the liquid crystal material is preferably 10 mPa·sec to 150 mPa·sec inclusive.

In FIG. 7(A), the backlight unit 30 has a structure in which the light guide plate 39 is used to make light enter from the substrate 31 side; however, the backlight unit 30 may have a structure in which the light-emitting element 33 is provided directly under the pixel to face the substrate 31. For example, a structure in which a planar light-emitting element is provided so as to face the substrate 31 may be employed.

Figure 7B:
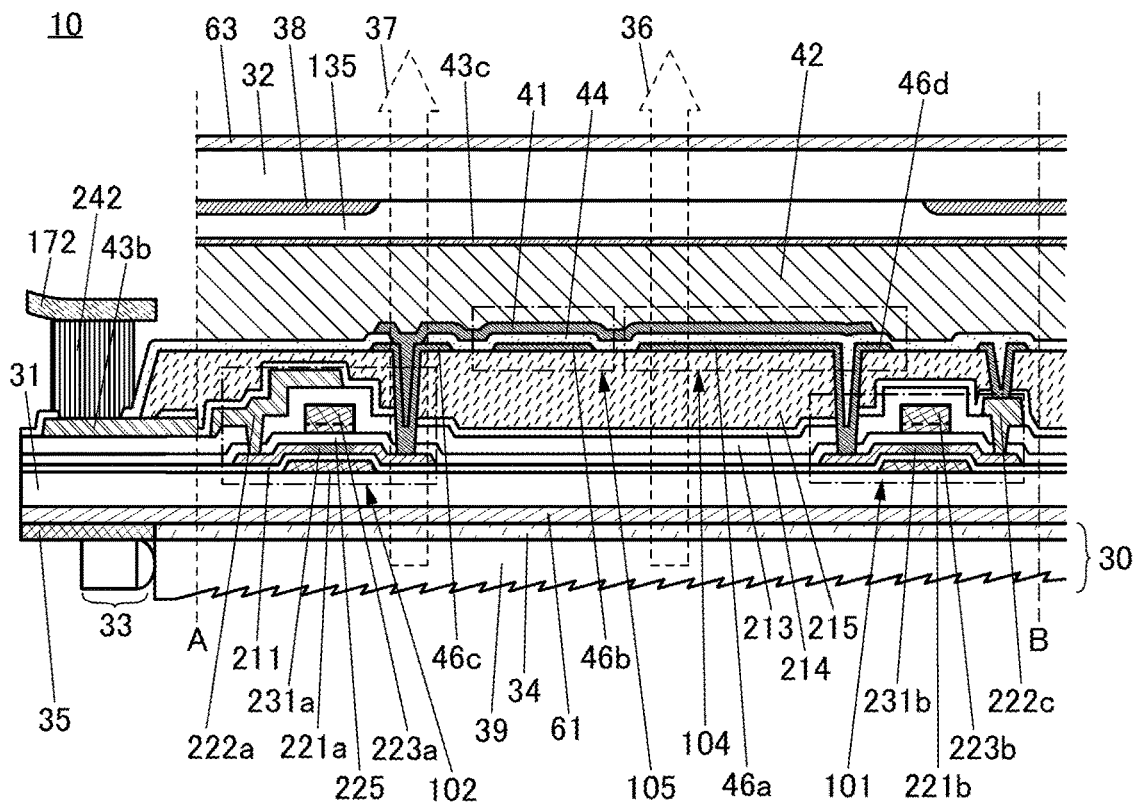

FIG. 7(B) illustrates an example in which an electrode to be electrically connected to the one of the source and the drain of the transistor 101 is formed with the use of a conductive layer 46d which is formed of the same layer as the conductive layer 46c. The conductive layer 46d has a function of allowing visible light to pass through. In FIG. 7(B), the semiconductor layer 231b overlapping with the conductive layer 46d also has a function of allowing visible light to pass through; in a region where the semiconductor layer 231b and the conductive layer 46d overlap with each other but do not overlap with the conductive layer 223b, light emitted from the backlight unit 30 can be emitted to the substrate 32 side.

<Materials of Components>

Next, the details of materials and the like that can be used for components of the display device and the display module of this embodiment are described.

There are no strict limitation on the material for a substrate included in the display device; a variety of substrates can be used. For example, a glass substrate, a quartz substrate, a sapphire substrate, a semiconductor substrate, a ceramic substrate, a metal substrate, a plastic substrate, or the like can be used.

The use of a thin substrate can reduce the weight and thickness of the display device. Furthermore, the use of a substrate that is thin enough to have flexibility allows a flexible display device to be obtained.

Liquid crystal materials include a positive liquid crystal material with a positive dielectric anisotropy ($\Delta\varepsilon$) and a negative liquid crystal material with a negative dielectric anisotropy. Either of the materials can be used in one embodiment of the present invention, and an optimal liquid crystal material can be used according to the employed mode and design.

The display device can employ a liquid crystal element having a variety of modes. For example, a TN mode, an FFS mode, an IPS mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an ECB (Electrically Controlled Birefringence) mode, a VA-IPS mode, a guest-host mode, or the like can be used for a liquid crystal element.

Note that the liquid crystal element is an element that controls transmission and non-transmission of light by the optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As described above, in the display device of this embodiment, a liquid crystal element can be driven with application of high voltage; therefore, a liquid crystal exhibiting a blue phase may be used. The blue phase is one of the liquid crystal phases, which appears just before a cholesteric phase changes into an isotropic phase when the temperature of a cholesteric liquid crystal is increased. Since the blue phase appears only in a narrow temperature range, a liquid crystal composition in which a chiral material is mixed to account for 5 weight % or more is used for the liquid crystal layer in order to improve the temperature range. The liquid crystal composition that contains liquid crystal exhibiting a blue phase and a chiral material has a short response speed and exhibits optical isotropy. In addition, the liquid crystal composition containing a liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the display panel in the manufacturing process can be reduced.

A light-scattering liquid crystal element may be used as the liquid crystal element. The light-scattering liquid crystal element is preferably an element containing a composite material of liquid crystal and a polymer molecule. For example, a polymer dispersed liquid crystal (PDLC) element can be used. Alternatively, a polymer network liquid crystal (PNLC) element may be used.

The light-scattering liquid crystal element has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be, for example, a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal element performs display by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal element, a difference in a refractive index between the liquid crystal portion and the resin portion becomes small in a direction, and incident light along the direction passes without being scattered in the liquid crystal portion. Thus, the light-scattering liquid crystal element is perceived in a transparent state from the direction. In contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal element is in an opaque state regardless of the viewing direction.

In the case where the light-scattering liquid crystal element is used, the alignment film and the polarizing plate are not necessary.

In the case where a light-scattering liquid crystal element is used as a liquid crystal element, for example, the display device is operated in a mode where light is transmitted when the light-scattering liquid crystal element is turned off, e.g., in a state where voltage is not applied or the absolute value of the applied voltage is small, and light is scattered when the light-scattering liquid crystal element is turned on, i.e., when the absolute value of the applied voltage is increased. With such a structure, the display device can be transparent in a normal state (without display). In that case, color display can be performed when light scattering operation is performed. Such operation is referred to as a reverse mode in some cases.

For example, a material containing one or more kinds selected from indium (In), zinc (Zn), and tin (Sn) is preferably used as the conductive material transmitting visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, zinc oxide containing gallium, and the like are given. Note that a film containing graphene can be used as well. The film including graphene can be formed, for example, by reducing a film including graphene oxide.

A conductive film that transmits visible light can be formed using an oxide semiconductor (hereinafter a conductive film formed using an oxide semiconductor is also referred to as an oxide conductive layer). For example, the oxide conductive layer preferably includes indium and further preferably includes an In—M—Zn oxide (M is Al, Ti, Ga, Y, Zr, La, Ce, Nd, Sn, or Hf).

An oxide semiconductor is a semiconductor material whose resistance can be controlled by oxygen vacancies in the film and/or the concentration of impurities such as hydrogen and water in the film. Thus, the resistivity of the oxide conductive layer can be controlled by selecting treatment for increasing oxygen vacancies and/or impurity concentration or treatment for reducing oxygen vacancies and/or impurity concentration, for an oxide semiconductor layer.

Note that such an oxide conductive layer formed using an oxide semiconductor can also be referred to as an oxide semiconductor layer having a high carrier density and a low resistance, an oxide semiconductor layer having conductivity, or an oxide semiconductor layer having high conductivity.

A transistor included in the display device of this embodiment may have either a top-gate structure or a bottom-gate structure. Gate electrodes may be provided above and below a channel. A semiconductor material used in the transistor is not particularly limited, and examples of the semiconductor material include an oxide semiconductor, silicon, and germanium.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

For example, a Group 14 element, a compound semiconductor, or an oxide semiconductor can be used for the semiconductor layer. Typically, a semiconductor containing silicon, a semiconductor containing gallium arsenide, an oxide semiconductor containing indium, or the like can be used for the semiconductor layer.

An oxide semiconductor is preferably used as a semiconductor in which a channel of the transistor is formed. In particular, an oxide semiconductor having a wider band gap than silicon is preferably used. Using a semiconductor material having a wider band gap and a lower carrier density than silicon is preferable because the off-state current of a transistor can be reduced.

The use of an oxide semiconductor makes it possible to provide a highly reliable transistor in which a change in the electrical characteristics is reduced.

Charge accumulated in a capacitor through the transistor can be retained for a long time because of the low off-state current. The use of such a transistor in a pixel allows a driver circuit to stop with the gray level of a displayed image maintained. As a result, the display device with significantly reduced power consumption can be obtained.

The transistors preferably contain an oxide semiconductor layer that is highly purified to inhibit the formation of oxygen vacancies. This can reduce the current in an off state (off-state current) of the transistors. Accordingly, the holding time of an electrical signal such as an image signal can be made longer, and a writing interval can also be set longer in an on state. Accordingly, the frequency of refresh operation can be reduced, which leads to an effect of suppressing power consumption.

The transistor using the oxide semiconductor can have relatively high field-effect mobility and thus can operate at high speed. With the use of such transistors that are capable of high-speed operation in the display device, the transistor in the display portion and the transistors in the driver circuit portion can be formed over the same substrate. That is, a semiconductor device separately formed with a silicon wafer or the like does not need to be used as the driver circuit, which enables a reduction in the number of components of the display device. In addition, with the use of the transistor that can operate at high speed also in the display portion, a high-quality image can be provided.

The transistors included in the gate driver GD_L and the gate driver GD_R and the transistor included in the display region 100 may have the same structure or different structures. The transistors included in the gate drivers may have the same structure or the combination of two or more kinds of structures. Similarly, the transistors included in the display region 100 may have the same structure or the combination of two or more kinds of structures.

An organic insulating material or an inorganic insulating material can be used as an insulating material that can be used for the insulating layers, the overcoat, or the like included in the display device. Examples of the organic insulating material include an acrylic resin, an epoxy resin, a polyimide resin, a polyamide resin, a polyimide-amide resin, a siloxane resin, a benzocyclobutene-based resin, and a phenol resin. As inorganic insulating layers, a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like can be given.

The conductive layers for the gate, the source, and the drain of the transistor and various wirings, electrodes, and the like of the display device can have a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; or the like can be employed. For example, in the case where the conductive layer has a three-layer structure, it is preferable that each of the first layer and the third layer be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. Note that light-transmitting conductive materials such as ITO, indium oxide containing tungsten oxide, indium zinc oxide containing tungsten oxide, indium oxide containing titanium oxide, indium tin oxide containing titanium oxide, indium zinc oxide, or ITSO may be used. Note that an oxide conductive layer may be formed by controlling the resistivity of an oxide semiconductor.

For the insulating layer 44 or the like functioning as a dielectric of the capacitor, a silicon nitride film is suitable.

A curable resin such as a heat-curable resin, a photocurable resin, or a two-component-mixture-type curable resin can be used as the adhesive layer 141. For example, an acrylic resin, a urethane resin, an epoxy resin, or a siloxane resin can be used.

As the connector 242, for example, an anisotropic conductive film (ACF) or an anisotropic conductive paste (ACP) can be used.

The coloring layer is a colored layer that transmits light in a specific wavelength range. Examples of a material that can be used for the coloring layer include a metal material, a resin material, and a resin material containing a pigment or dye.

The light-blocking layer 38 is provided, for example, between adjacent coloring layers for different colors. A black matrix formed with, for example, a metal material or a resin material containing a pigment or dye can be used as the light-blocking layer 38. Note that it is preferable to provide the light-blocking layer 38 also in a region other than the display portion, such as the driver circuit portion, in which case leakage of guided light or the like can be inhibited.

As the backlight unit 30, a direct-below backlight, an edge-light type backlight, or the like can be used. As a light source, an LED (Light Emitting Diode), an organic EL (Electroluminescence) element, or the like can be used.

The thin films included in the display device (the insulating film, the semiconductor film, the conductive film, and the like) can be formed by a sputtering method, a chemical vapor deposition (CVD) method, a vacuum evaporation method, a pulsed laser deposition (PLD) method, an atomic layer deposition (ALD) method, or the like. As examples of the CVD method, a plasma enhanced chemical vapor deposition (PECVD) method, a thermal CVD method, and the like can be given. As an example of the thermal CVD method, a metal organic chemical vapor deposition (MOCVD: Metal Organic CVD) method can be given.

The thin films included in the display device (the insulating film, the semiconductor film, the conductive film, and the like) can each be formed by a method such as spin coating, dipping, spray coating, inkjet printing, dispensing, screen printing, offset printing, slit coating, roll coating, curtain coating, or knife coating, or with a tool such as a doctor knife.

The thin films included in the display device can be processed using a photolithography method or the like. Alternatively, island-shaped thin films may be formed by a film formation method using a blocking mask. Alternatively, the thin films may be processed by a nanoimprinting method, a sandblasting method, a lift-off method, or the like. Examples of the photolithography method include a method in which a resist mask is formed over a thin film to be processed, the thin film is processed by etching or the like, and the resist mask is removed, and a method in which a photosensitive thin film is formed and then exposed to light and developed to be processed into a desired shape.

As light used for light exposure in a photolithography method, for example, an i-line (a wavelength of 365 nm), a g-line (a wavelength of 436 nm), an h-line (a wavelength of 405 nm), and light in which the i-line, the g-line, and the h-line are mixed can be given. Alternatively, ultraviolet light, KrF laser light, ArF laser light, or the like can be used. Furthermore, exposure may be performed by liquid immersion light exposure technique. Examples of light used for light exposure include extreme ultraviolet (EUV) light and X-rays. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin films, a dry etching method, a wet etching method, a sandblasting method, or the like can be used.

This embodiment can be combined with the other embodiments as appropriate.

Embodiment 2

In this embodiment, an example of a transistor that can be used in one embodiment of the present invention is described.

[Structure Example 1]

Figure 8A:
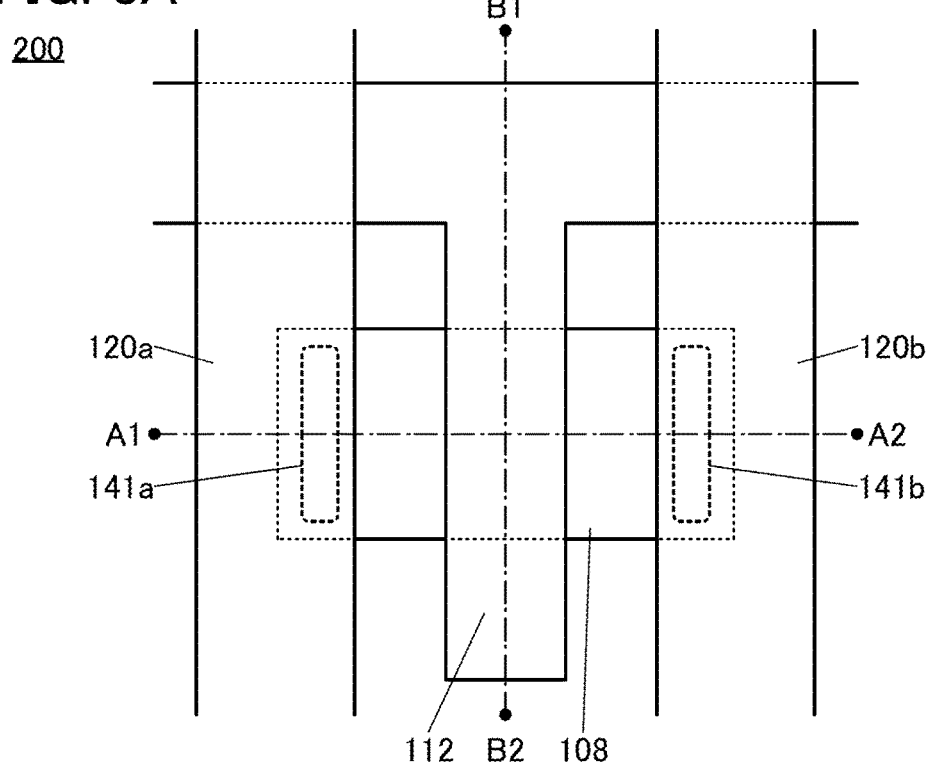
FIG. 8 (A) is a top view of a transistor. (B) is a cross-sectional view of the transistor. (C) is a cross-sectional view of the transistor.
Figure 8B:
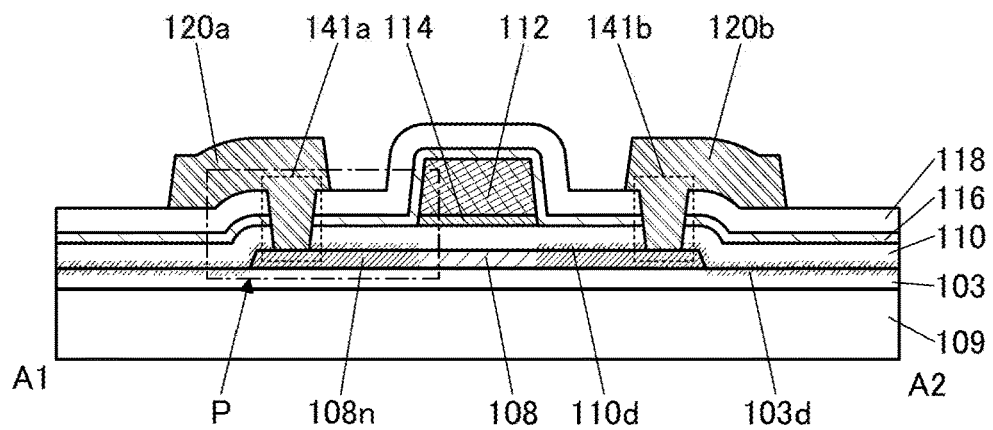
Figure 8C:
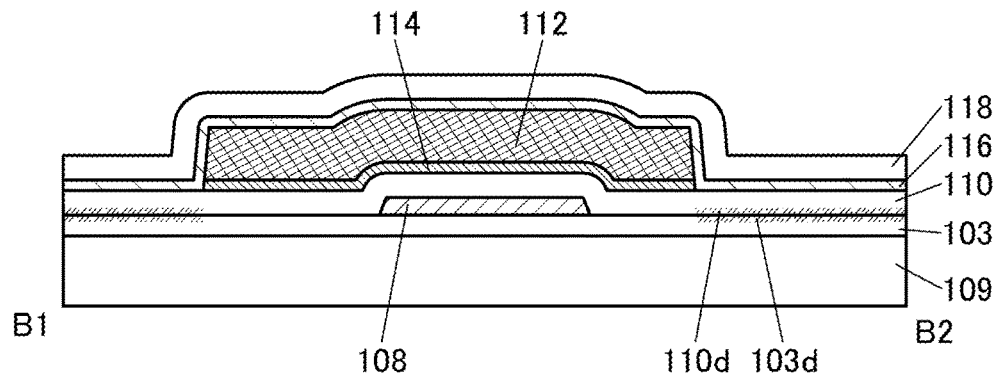

FIG. 8(A) is a top view of a transistor 200. FIG. 8(B) corresponds to a cross-sectional view of a cut plane taken along a dashed-dotted line A1-A2 in FIG. 8(A). FIG. 8(C) corresponds to a cross-sectional view of a cut plane taken along a dashed-dotted line B1-B2 in FIG. 8(A). Note that in FIG. 8(A), some components of the transistor 200 (a gate insulating layer and the like) are not illustrated. In addition, the direction of the dashed-dotted line A1-A2 corresponds to a channel length direction, and the direction of the dashed-dotted line B1-B2 corresponds to a channel width direction. Furthermore, some components are not illustrated in top views of transistors in the following drawings, as in FIG. 8(A).

The transistor 200 is provided over a substrate 109 and includes an insulating layer 103, a semiconductor layer 108, an insulating layer 110, a metal oxide layer 114, a conductive layer 112, an insulating layer 116, an insulating layer 118, and the like. The island-shaped semiconductor layer 108 is provided over the insulating layer 103. The insulating layer 110 is provided in contact with a top surface of the insulating layer 103 and a top surface and a side surface of the semiconductor layer 108. The metal oxide layer 114 and the conductive layer 112 are provided to be stacked in that order over the insulating layer 110 and include portions overlapping with the semiconductor layer 108. The insulating layer 116 is provided to cover a top surface of the insulating layer 110, a side surface of the metal oxide layer 114, and a top surface and a side surface of the conductive layer 112. The insulating layer 118 is provided to cover the insulating layer 116.

Part of the conductive layer 112 functions as a gate electrode. Part of the insulating layer 110 functions as a gate insulating layer. The transistor 200 is what is called a top-gate transistor, in which the gate electrode is provided over the semiconductor layer 108.

In addition, as illustrated in FIGS. 8(A) and 8(B), the transistor 200 may include a conductive layer 120a and a conductive layer 120b over the insulating layer 118. The conductive layer 120a and the conductive layer 120b function as a source electrode and a drain electrode. The conductive layer 120a and the conductive layer 120b are electrically connected to regions 108n to be described later through an opening portion 141a and an opening portion 141b, respectively, which are provided in the insulating layer 118, the insulating layer 116, and the insulating layer 110.

The semiconductor layer 108 preferably contains a metal oxide.

The semiconductor layer 108 preferably contains indium, M (M is one kind or a plurality of kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one kind or a plurality of kinds selected from aluminum, gallium, yttrium, and tin.

It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

The conductive layer 112 and the metal oxide layer 114 are processed to have substantially the same top surface shapes.

Note that in this specification and the like, the expression "having substantially the same top surface shapes" means that at least outlines of stacked layers partly overlap with each other. For example, the case of processing or partly processing an upper layer and a lower layer with the use of the same mask pattern is included. However, in some cases, the outlines do not completely overlap with each other and the outline of the upper layer is positioned on the outline of an inner side of the lower layer or the outline of the upper layer is positioned on an outer side of the outline of the lower layer; such a case is also represented by the expression "having substantially the same top surface shapes."

The metal oxide layer 114 positioned between the insulating layer 110 and the conductive layer 112 functions as a barrier film that prevents diffusion of oxygen contained in the insulating layer 110 into a conductive layer 112 side. Furthermore, the metal oxide layer 114 also functions as a barrier film that prevents diffusion of hydrogen and water contained in the conductive layer 112 into an insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 to the semiconductor layer 108 through the insulating layer 110 can be prevented. Consequently, carrier density in a channel formation region of the semiconductor layer 108 can be extremely low.

For the metal oxide layer 114, an insulating material or a conductive material can be used. When the metal oxide layer 114 has an insulating property, the metal oxide layer 114 functions as part of the gate insulating layer. In contrast, when the metal oxide layer 114 has conductivity, the metal oxide layer 114 functions as part of the gate electrode.

An insulating material having a higher permittivity than silicon oxide is preferably used for the metal oxide layer 114. It is particularly preferable to use an aluminum oxide film, a hafnium oxide film, a hafnium aluminate film, or the like because drive voltage can be reduced.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

Alternatively, for the metal oxide layer 114, an oxide material containing one or more of the same elements as those of the semiconductor layer 108 is preferably used. It is particularly preferable to use an oxide semiconductor material that can be used for the semiconductor layer 108. Here, a metal oxide film formed using the same sputtering target as that for the semiconductor layer 108 is preferably applied to the metal oxide layer 114 because an apparatus can be shared.

Alternatively, when a metal oxide material containing indium and gallium is used for both the semiconductor layer 108 and the metal oxide layer 114, a material in which the composition ratio (content ratio) of gallium is higher than that in the material of the semiconductor layer 108 is preferably used for the metal oxide layer 114 because an oxygen blocking property of the metal oxide layer 114 can be further increased. Here, when a material in which the composition ratio of indium is higher than that in the material of the metal oxide layer 114 is used for the semiconductor layer 108, field-effect mobility of the transistor 200 can be increased.

In addition, the metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 or the semiconductor layer 108.

The semiconductor layer 108 includes a region overlapping with the conductive layer 112 and a pair of low-resistance regions 108n between which the region is sandwiched. A region of the semiconductor layer 108 that overlaps with the conductive layer 112 functions as a channel formation region of the transistor 200. Meanwhile, the regions 108n function as a source region and a drain region of the transistor 200.

The low-resistance region 108n can also be regarded as a region having lower resistance than the channel formation region, a region having a higher carrier concentration than the channel formation region, a region having higher oxygen defect density than the channel formation region, a region having a higher impurity concentration than the channel formation region, or an n-type region.

The low-resistance region 108n of the semiconductor layer 108 is a region containing an impurity element. Examples of the impurity element include hydrogen, boron, carbon, nitrogen, fluorine, phosphorus, sulfur, arsenic, aluminum, and a rare gas. Note that typical examples of a rare gas include helium, neon, argon, krypton, and xenon. In particular, boron or phosphorus is preferably contained. Alternatively, two or more of these elements may be contained.

The insulating layer 110 includes a region in contact with the channel formation region of the semiconductor layer 108, i.e., a region overlapping with the conductive layer 112. The insulating layer 110 further includes a region that is in contact with the low-resistance region 108n of the semiconductor layer 108 and does not overlap with the conductive layer 112.

In addition, for each of the insulating layer 103 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. Accordingly, heat treatment or the like in the manufacturing process of the transistor 200 can supply oxygen released from the insulating layer 103 and the insulating layer 110 to the channel formation region of the semiconductor layer 108 to reduce oxygen vacancies in the semiconductor layer 108.

Figure 9:
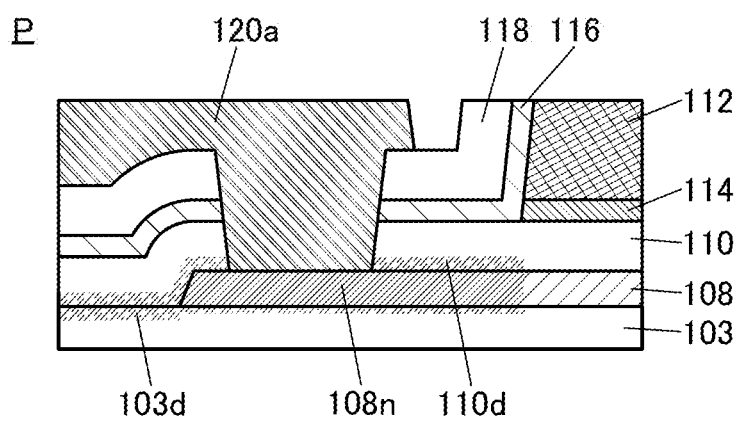
FIG. 9 A cross-sectional view of a transistor.

FIG. 9 shows an enlarged cross-sectional view of a region P surrounded by a dashed-dotted line in FIG. 8(B).

The insulating layer 110 includes a region 110d that contains the impurity element. The region 110d is positioned at least in the vicinity of an interface with the low-resistance region 108n. In addition, the region 110d is not provided with the semiconductor layer 108 and is also positioned at least in the vicinity of an interface with the insulating layer 103 in a region not overlapping with the insulating layer 112. Furthermore, it is preferable that the region 110d not be provided in a portion that is in contact with the channel formation region of the semiconductor layer 108, as illustrated in FIG. 8(B), FIG. 8(C), and FIG. 9.

In addition, the insulating layer 103 includes a region 103d containing the impurity element in the vicinity of an interface in contact with the insulating layer 110. Furthermore, as illustrated in FIG. 9, the region 103d may also be provided in the vicinity of an interface in contact with the region 108n. In that case, a portion overlapping with the region 108n has a lower impurity concentration than a portion in contact with the insulating layer 110.

Here, the region 108n preferably has a concentration gradient such that the impurity concentration is higher in a portion closer to the insulating layer 110. In that case, an upper portion of the region 108n has lower resistance, and thus contact resistance with the conductive layer 120a (or the conductive layer 120b) can be more effectively reduced. In addition, the total amount of the impurity in the region 108n can be smaller than that in the case where the concentration is uniform throughout the entire region 108n; thus, the amount of the impurity that might be diffused into the channel formation region owing to the influence of heat applied during the manufacturing process, or the like can be kept small.

In addition, the region 110d preferably has a concentration gradient such that the impurity concentration is higher in a portion closer to the semiconductor layer 108. In the insulating layer 110 to which an oxide film from which oxygen can be released by heating is applied, release of oxygen in the region 110d to which the impurity element is added can be reduced as compared to that in the other regions. Thus, the region 110d that is positioned in the vicinity of an interface with the region 108n in the insulating layer 110 can function as a blocking layer against oxygen and can effectively reduce oxygen supplied to the region 108n.

As described later, treatment for adding the impurity element to the region 108n and the region 110d can be performed using the conductive layer 112 as a mask. Accordingly, the region 110d can be formed in a self-aligned manner at the same time as formation of the region 108n.

Note that in FIG. 9 and the like, to show that a high-impurity-concentration portion of the insulating layer 110 is positioned in the vicinity of an interface with the semiconductor layer 108 in an exaggerated way, the region 110d is illustrated with a hatch pattern only in the vicinity of the semiconductor layer 108 in the insulating layer 110; however, the impurity element is actually contained in the entire insulating layer 110 in a thickness direction.

The region 108n and the region 110d each preferably include a region whose impurity concentration is $1\times10^{19}$ atoms/cm$^3$ to $1\times10^{23}$ atoms/cm$^3$ inclusive, preferably $5\times10^{19}$ atoms/cm$^3$ to $5\times10^{22}$ atoms/cm$^3$ inclusive, further preferably $1\times10^{20}$ atoms/cm$^3$ to $1\times10^{22}$ atoms/cm$^3$ inclusive. In addition, the region 108n preferably includes a portion having a higher impurity concentration than the region 110d of the insulating layer 110 because the electrical resistance of the region 108n can be further effectively reduced.

The concentrations of the impurities contained in the region 108n and the region 110d can be analyzed by an analysis method such as secondary ion mass spectrometry (SIMS) or X-ray photoelectron spectroscopy (XPS), for example. In the case of using XPS analysis, it is possible to find out concentration distribution in a depth direction by the combination of XPS analysis and ion sputtering from a front surface side or a rear surface side.

In addition, the impurity element preferably exists in an oxidized state in the region 108n. For example, it is preferable to use an element that is easily oxidized, such as boron, phosphorus, magnesium, aluminum, or silicon, as the impurity element. Since such an element that is easily oxidized can exist stably in a state of being bonded to oxygen in the semiconductor layer 108 to be oxidized, the element can be inhibited from being released even when a high temperature (e.g., higher than or equal to 400° C., higher than or equal to 600° C., or higher than or equal to 800° C.) is applied in a later step. Furthermore, the impurity element takes oxygen in the semiconductor layer 108 away, and many oxygen vacancies are generated in the region 108n. The oxygen vacancies are bonded to hydrogen in a film to serve as carrier supply sources; thus, the region 108n is in an extremely low-resistance state.

Note that an increase in resistance might be caused if much oxygen is supplied from the outside or a film near the region 108n to the region 108n at the time of performing high-temperature treatment in a later step. Thus, in the case where high-temperature treatment is performed, the treatment is preferably performed with the region 108n covered with the insulating layer 116 that has a high barrier property against oxygen.

In addition, the impurity element preferably exists in an oxidized state also in the region 110d. Since such an element that is easily oxidized can exist stably in a state of being bonded to oxygen in the insulating layer 110 to be oxidized, the element can be inhibited from being released even when a high temperature is applied in a later step. Furthermore, particularly in the case where oxygen (also referred to as excess oxygen) that might be released by heating is contained in the insulating layer 110, excess oxygen and the impurity element are bonded to each other and stabilized, so that oxygen can be inhibited from being supplied from the region 110d to the region 108n. Moreover, oxygen is less likely to be diffused into the region 110d containing the impurity element in the oxidized state, so that oxygen can also be prevented from being supplied from a portion above the region 110d to the region 108n through the region 110d.

For example, in the case where boron is used as the impurity element, boron contained in the 1 region 108n and the region 110d can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise at the measurement lower limit.

Each of the insulating layer 116 and the insulating layer 118 functions as a protective layer protecting the transistor 200. In addition, either the insulating layer 116 or the insulating layer 118 preferably has a function of preventing diffusion of oxygen that might be released from the insulating layer 110 to the outside. For example, an inorganic insulating material such as an oxide or a nitride can be used. More specifically, for example, an inorganic insulating material such as silicon nitride, silicon nitride oxide, silicon oxynitride, aluminum oxide, aluminum oxynitride, aluminum nitride, hafnium oxide, or hafnium aluminate can be used.

Note that although the case where a stacked-layer structure of the insulating layer 116 and the insulating layer 118 is employed as the protective layer is described here, either the insulating layer 116 or the insulating layer 118 is not necessarily provided when not needed.

Here, the semiconductor layer 108 and oxygen vacancies that might be formed in the semiconductor layer 108 will be described.

Oxygen vacancies formed in the semiconductor layer 108 adversely affect the transistor characteristics and therefore cause a problem. For example, when an oxygen vacancy is formed in the semiconductor layer 108, the oxygen vacancy might be bonded to hydrogen to serve as a carrier supply source. The carrier supply source generated in the semiconductor layer 108 causes a change in the electrical characteristics, typically, a shift in the threshold voltage, of the transistor 200. Therefore, it is preferable that the amount of oxygen vacancies in the semiconductor layer 108 be as small as possible.

In view of this, in one embodiment of the present invention, insulating films in the vicinity of the semiconductor layer 108, specifically, the insulating layer 110 positioned above the semiconductor layer 108 and the insulating layer 103 positioned below the semiconductor layer 108 each include an oxide film. When oxygen is moved from the insulating layer 103 and the insulating layer 110 to the semiconductor layer 108 by heat during the manufacturing process or the like, the amount of oxygen vacancies in the semiconductor layer 108 can be reduced.

In addition, the semiconductor layer 108 preferably includes a region where the atomic proportion of In is higher than the atomic proportion of M. A higher atomic proportion of In results in higher field-effect mobility of the transistor.

Here, in the case of a metal oxide containing In, Ga, and Zn, bonding strength between In and oxygen is weaker than bonding strength between Ga and oxygen; thus, with a higher atomic proportion of In, oxygen vacancies are likely to be generated in the metal oxide film. There is a similar tendency even when a metal element shown above as M is used instead of Ga. The existence of a large amount of oxygen vacancies in the metal oxide film leads to a reduction in electrical characteristics and a reduction in reliability of the transistor.

However, in one embodiment of the present invention, an extremely large amount of oxygen can be supplied into the semiconductor layer 108 containing a metal oxide; thus, a metal oxide material with a high atomic proportion of In can be used. Accordingly, it is possible to achieve a transistor with extremely high field-effect mobility, stable electrical characteristics, and high reliability.

For example, a metal oxide in which the atomic proportion of In is 1.5 times or higher, 2 times or higher, 3 times or higher, 3.5 times or higher, or 4 times or higher the atomic proportion of M can be suitably used.

It is particularly preferable that the atomic ratio of In, M, and Zn in the semiconductor layer 108 be In:M:Zn=5:1:6 or in the neighborhood thereof (M be 0.5 to 1.5 inclusive and Zn be 5 to 7 inclusive when In is 5). Alternatively, the atomic ratio of In, M, and Zn is preferably In:M:Zn=4:2:3 or in the neighborhood thereof. Furthermore, as the composition of the semiconductor layer 108, the atomic proportions of In, M, and Zn in the semiconductor layer 108 may be approximately equal to each other. That is, a material in which the atomic ratio of In, M, and Zn is In:M:Zn=1:1:1 or in the neighborhood thereof may be included.

For example, with the use of the transistor with high field-effect mobility in a gate driver that generates a gate signal, a display device with small frame width (also referred to as a narrow frame) can be provided. Furthermore, with the use of the transistor with high field-effect mobility in a source driver (particularly a demultiplexer connected to an output terminal of a shift register included in the source driver), a display device to which fewer wirings are connected can be provided.

Note that even when the semiconductor layer 108 includes the region where the atomic proportion of In is higher than the atomic proportion of M, the field-effect mobility might be low if the semiconductor layer 108 has high crystallinity. The crystallinity of the semiconductor layer 108 can be analyzed by using X-ray diffraction (XRD) or a transmission electron microscope (TEM), for example.

Here, impurities such as hydrogen or moisture entering the semiconductor layer 108 adversely affect the transistor characteristics and therefore cause a problem. Thus, it is preferable that the amount of impurities such as hydrogen or moisture in the semiconductor layer 108 be as small as possible. It is preferable to use a metal oxide film in which the impurity concentration is low and the density of defect states is low because a transistor having excellent electrical characteristics can be manufactured. By reducing the impurity concentration and reducing the density of defect states (reducing oxygen vacancies), the carrier density in the film can be reduced. A transistor using such a metal oxide film for a semiconductor layer rarely has electrical characteristics with a negative threshold voltage (also referred to as normally-on). Furthermore, a transistor using such a metal oxide film can have characteristics of an extremely low off-state current.

In addition, the semiconductor layer 108 may have a stacked-layer structure of two or more layers.

For example, the semiconductor layer 108 in which two or more metal oxide films with different compositions are stacked can be used. For instance, in the case of using an In-M-Zn oxide, it is preferable to use a stack of two or more films each formed using a sputtering target with an atomic ratio of In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

Alternatively, the semiconductor layer 108 in which two or more metal oxide films with different crystallinities are stacked can be used. In that case, the metal oxide films are preferably successively formed without exposure to the air using the same oxide target under different deposition conditions.

For example, the oxygen flow rate ratio at the time of depositing an earlier-formed first metal oxide film is set lower than that at the time of depositing a subsequently formed second metal oxide film. Alternatively, a condition without oxygen flowing is employed at the time of depositing the first metal oxide film. In such a manner, oxygen can be effectively supplied at the time of depositing the second metal oxide film. In addition, the first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or depositing the insulating layer 110 can be inhibited.

More specifically, the oxygen flow rate ratio at the time of depositing the first metal oxide film is higher than or equal to 0% and lower than 50%, preferably higher than or equal to 0% and lower than or equal to 30%, further preferably higher than or equal to 0% and lower than or equal to 20%, typically 10%. In addition, the oxygen flow rate ratio at the time of depositing the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Furthermore, although the conditions at the time of the deposition, such as pressure, temperature, and power may, vary between the first metal oxide film and the second metal oxide film, it is preferable to employ the same conditions except for the oxygen flow rate ratio because the time required for deposition steps can be shortened.

With such a structure, the transistor 200 with excellent electrical characteristics and high reliability can be achieved.

The above is the description of Structure Example 1.

Structure Example 2

A structure example of a transistor whose structure is partly different from that of Structure Example 1 will be described below. Note that description of the same portions as those in Structure Example 1 is omitted below in some cases. Furthermore, in drawings that are referred to later, the same hatching pattern is applied to portions having functions similar to those in the above structure example, and the portions are not denoted by reference numerals in some cases.

Figure 10A:
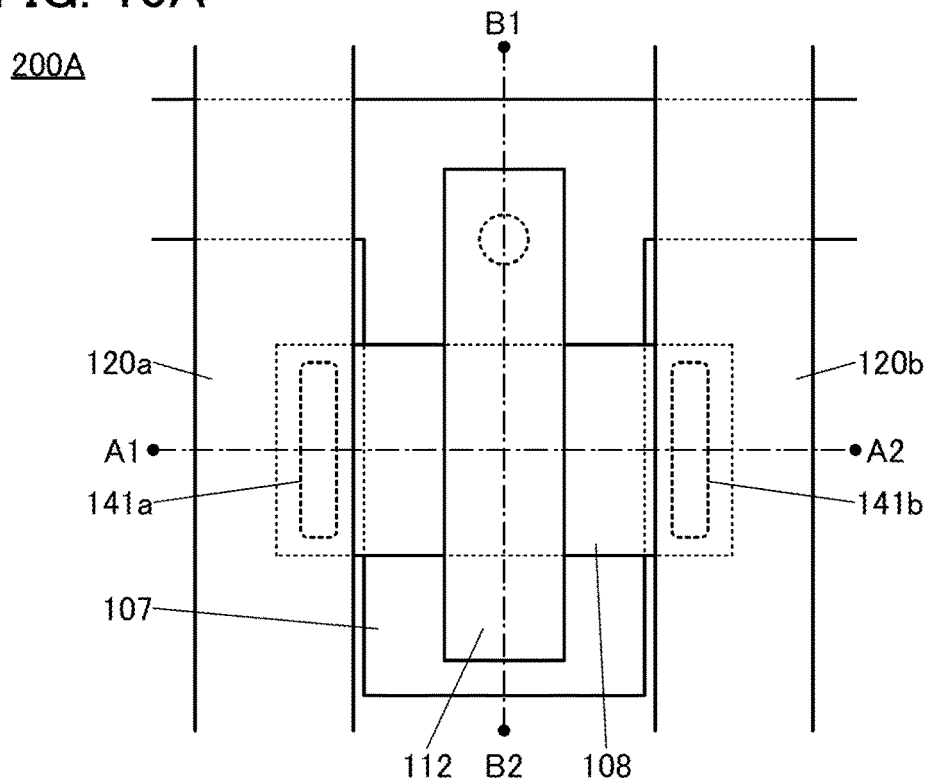
FIG. 10 (A) is a top view of a transistor. (B) is a cross-sectional view of the transistor. (C) is a cross-sectional view of the transistor.
Figure 10B:
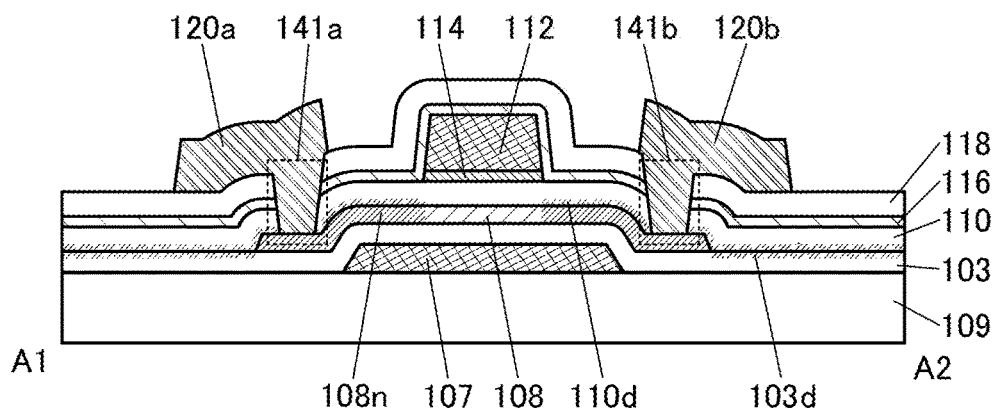
Figure 10C:
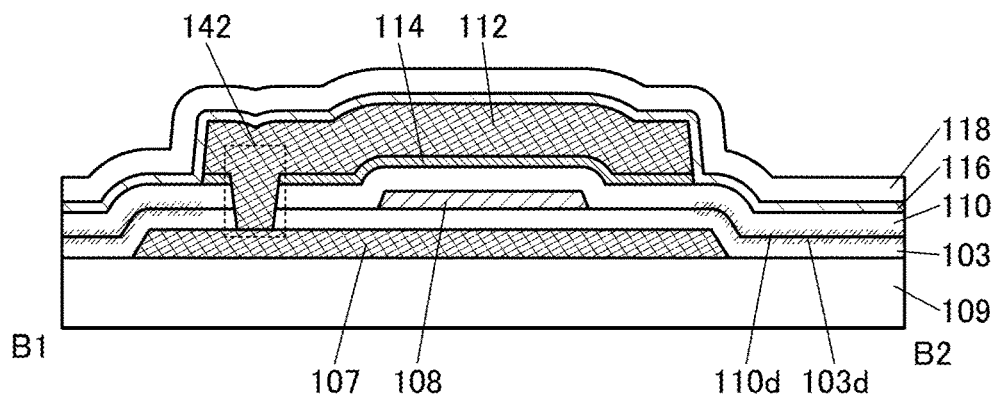

FIG. 10(A) is a top view of a transistor 200A. FIG. 10(B) is a cross-sectional view of the transistor 200A in a channel length direction. FIG. 10(C) is a cross-sectional view of the transistor 200A in a channel width direction.

The transistor 200A is different from the transistor 100 described in Structure Example 1 mainly in including a conductive layer 107 between the substrate 109 and the insulating layer 103. The conductive layer 107 includes a region overlapping with the semiconductor layer 108 and the conductive layer 112.

In the transistor 200A, the conductive layer 107 has a function of a first gate electrode (also referred to as a bottom gate electrode), and the conductive layer 112 has a function of a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 107 functions as a channel formation region. Note that for easy explanation, a portion of the semiconductor layer 108 that overlaps with the conductive layer 112 will be sometimes referred to as a channel formation region in the following description; however, a channel can also be actually formed in a portion not overlapping with the conductive layer 112 and overlapping with the conductive layer 107 (a portion including the region 108n).

In addition, as illustrated in FIG. 10(C), the conductive layer 107 may be electrically connected to the conductive layer 112 through an opening portion 142 provided in the metal oxide layer 114, the insulating layer 110, and the insulating layer 103. In that case, the same potential can be supplied to the conductive layer 107 and the conductive layer 112.

For the conductive layer 107, a material similar to that for the conductive layer 112, the conductive layer 120a, or the conductive layer 120b can be used. In particular, a material containing copper is preferably used for the conductive layer 107 because wiring resistance can be reduced.

In addition, as illustrated in FIGS. 10(A) and 10(C), the conductive layer 112 and the conductive layer 107 preferably extend beyond an end portion of the semiconductor layer 108 in the channel width direction. In that case, as illustrated in FIG. 10(C), a structure is employed in which the semiconductor layer 108 in the channel width direction is entirely covered with the conductive layer 112 and the conductive layer 107 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be applied to the conductive layer 107 and the conductive layer 112. In that case, electric fields for inducing a channel can be effectively applied to the semiconductor layer 108, so that the on-state current of the transistor 200A can be increased. Thus, the transistor 200A can also be miniaturized.

Note that a structure in which the conductive layer 112 and the conductive layer 107 are not connected to each other may be employed. In that case, a constant potential may be applied to one of the pair of gate electrodes, and a signal for driving the transistor 200A may be applied to the other of the pair of gate electrodes. In this case, the potential applied to one of the gate electrodes can control the threshold voltage at the time of driving the transistor 200A with the other gate electrode.

The above is the description of Structure Example 2.

This embodiment can be combined with the other embodiments as appropriate.

Embodiment 3

In this embodiment, electronic devices of one embodiment of the present invention are described with reference to FIGS. 11(A), 11(B) and 11(C), and FIGS. 12(A), 12(B), 12(C), 12(D), and 12(E).

An electronic device in this embodiment is provided with the display device of one embodiment of the present invention in a display portion. Therefore, the display portion of the electronic device can display a high-quality image. Moreover, display can be performed with high reliability in a wide temperature range.

The display unit of the electronic device of this embodiment can display an image with a resolution of, for example, full high definition, 2K, 4K, 8K, 16K, or more. In addition, the screen size of the display unit can be 20 inches diagonal or more, 30 inches diagonal or more, 50 inches diagonal or more, 60 inches diagonal or more, or 70 inches diagonal or more.

Examples of the electronic devices in which the display device of one embodiment of the present invention can be used include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor for a computer or the like, digital signage, and a large game machine such as a pachinko machine. Furthermore, the display device of one embodiment of the present invention can be suitably used in portable electronic devices, wearable electronic devices (wearable devices), VR (Virtual Reality) devices, AR (Augmented Reality) devices, and the like.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Furthermore, an electronic device including a plurality of display units can have a function of displaying image data mainly on one display unit while displaying text data mainly on another display unit, a function of displaying a three-dimensional image by displaying images on a plurality of display units with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display unit, or the like. Note that functions of the electronic device of one embodiment of the present invention are not limited thereto, and the electronic devices can have a variety of functions.

Figure 11A:
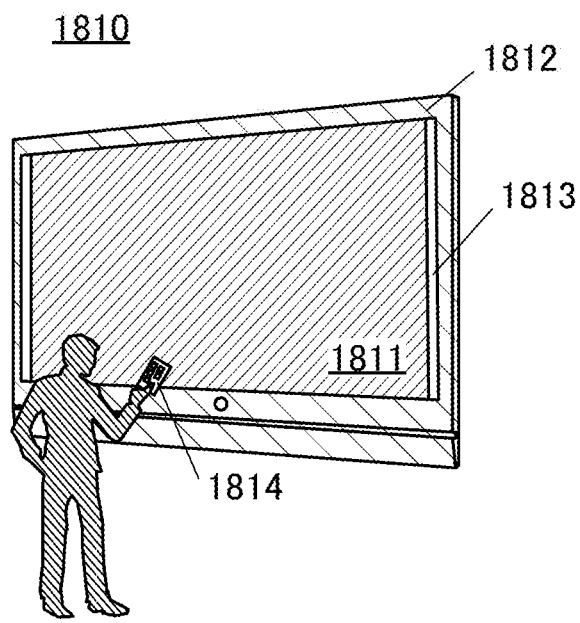
FIG. 11 (A) is a diagram illustrating an example of an electronic device. (B) is a diagram illustrating an example of an electronic device. (C) is a diagram illustrating an example of an electronic device.

FIG. 11(A) illustrates a television device 1810. The television device 1810 includes a display unit 1811, a housing 1812, a speaker 1813, and the like. Furthermore, the digital signage can include an LED lamp, operation keys (including a power switch or an operation switch), a connection terminal, a variety of sensors, a microphone, and the like.

The television device 1810 can be controlled with a remote controller 1814.

As airwaves the television device 1810 can receive, ground waves, waves transmitted from a satellite, and the like can be given. The example of the airwaves also include analog broadcasting, digital broadcasting, image-sound-only broadcasting, and sound-only broadcasting. For example, airwaves transmitted in a certain frequency band in a UHF band (approximately 300 MHz to 3 GHz) or a VHF band (30 MHz to 300 MHz) can be received. When a plurality of pieces of data received in a plurality of frequency bands is used, the transfer rate can be increased and more information can be obtained. Accordingly, the display unit 1811 can display an image with a resolution higher than the full high definition. For example, an image with a resolution of 4K, 8K, 16K, or higher can be displayed.

A structure may be employed in which an image to be displayed on the display unit 1811 is generated using broadcasting data transmitted with a technology for transmitting data via a computer network such as the Internet, a LAN (Local Area Network), or Wi-Fi (registered trademark). In that case, the television device 1810 does not necessarily include a tuner.

Figure 11B:
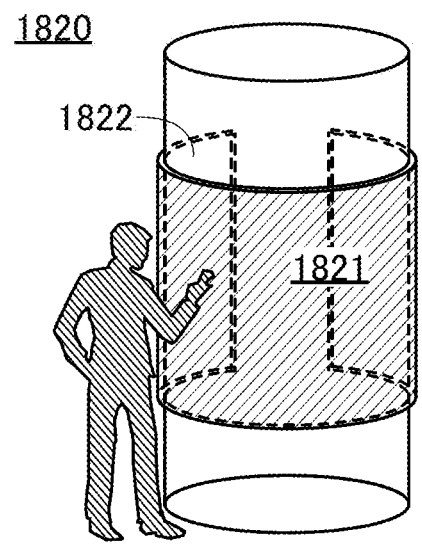

FIG. 11(B) illustrates a digital signage 1820 mounted on a cylindrical pillar 1822. The digital signage 1820 includes a display portion 1821.

The larger the display portion 1821 is, the more information the display portion 1821 can provide at a time. In addition, the larger the display portion 1821 is, the more the display portion 1821 attracts attention, so that the effectiveness of the advertisement can be increased, for example.

It is preferable to use a touch panel in the display portion 1821 because not only a still image or a moving image is displayed on the display portion 1821 but also users can operate intuitively. Moreover, for an application for providing information such as route information or traffic information, usability can be enhanced by intuitive operation.

Figure 11C:
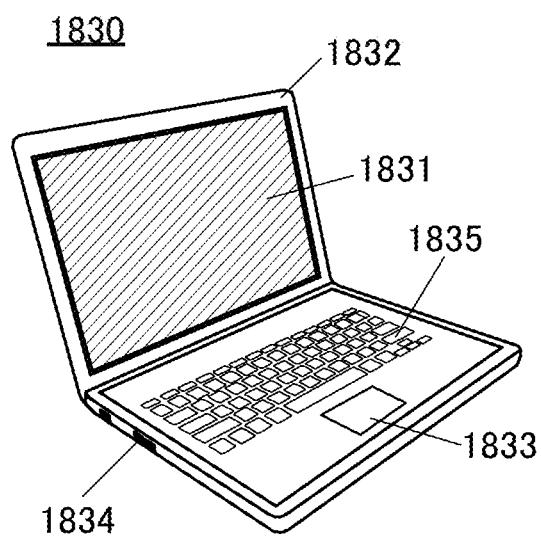

FIG. 11(C) illustrates a notebook personal computer 1830. The personal computer 1830 includes a display unit 1831, a housing 1832, a touch pad 1833, a connection port 1834, and the like.

The touch pad 1833 functions as an input means such as a pointing device or a pen tablet and can be controlled with a finger, a stylus, or the like.

Furthermore, a display element is incorporated in the touch pad 1833. As illustrated in FIG. 11(C), when input keys 1835 are displayed on a surface of the touch pad 1833, the touch pad 1833 can be used as a keyboard. In that case, a vibration module may be incorporated in the touch pad 1833 so that sense of touch is achieved by vibration when the input keys 1835 are touched.

Figure 12A:
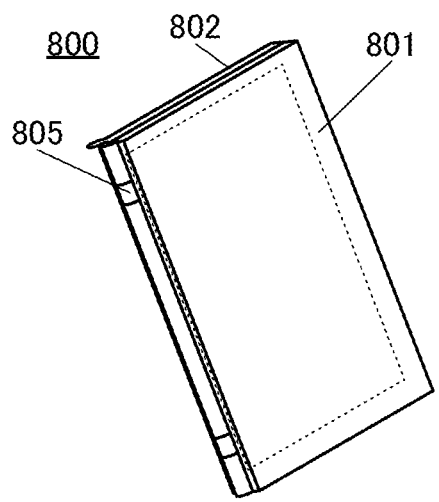
FIG. 12 (A) is a diagram illustrating an example of an electronic device. (B) is a diagram illustrating an example of an electronic device. (C) is a diagram illustrating an example of an electronic device. (D) is a diagram illustrating an example of an electronic device. (E) is a diagram illustrating an example of an electronic device.
Figure 12B:
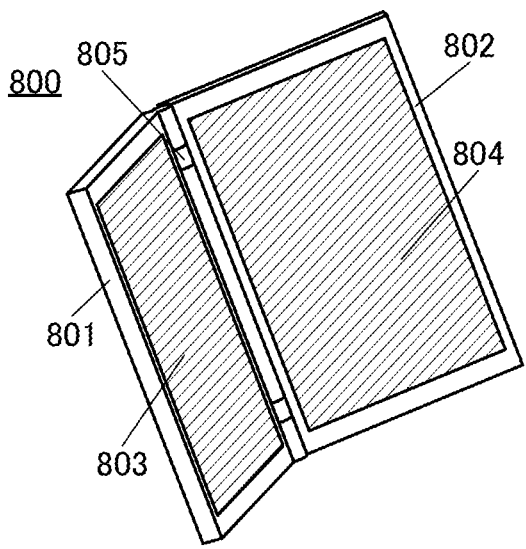

FIGS. 12(A) and 12(B) illustrate an example of a portable information terminal 800. The portable information terminal 800 includes a housing 801, a housing 802, a display portion 803, a display portion 804, a hinge portion 805, and the like.

The housing 801 and the housing 802 are joined together with the hinge portion 805. As for the portable information terminal 800, the housing 801 and the housing 802 can be opened as illustrated in FIG. 12(B) from a folded state illustrated in FIG. 12(A).

For example, text information can be displayed on the display portion 803 and the display portion 804; thus, the portable information terminal can be used as an e-book reader. Furthermore, still images and moving images can be displayed on the display portion 803 and the display portion 804.

The portable information terminal 800 can be folded when being carried, and thus is highly versatile.

Note that the housing 801 and the housing 802 may have a power button, an operation button, an external connection port, a speaker, a microphone, and the like.

Figure 12C:
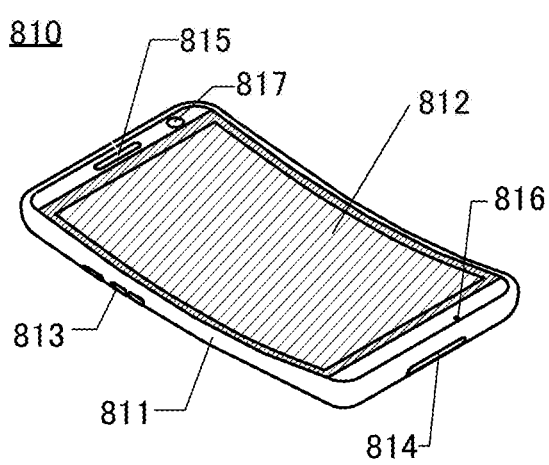

FIG. 12(C) illustrates an example of a portable information terminal. A portable information terminal 810 illustrated in FIG. 12(C) includes a housing 811, a display portion 812, an operation button 813, an external connection port 814, a speaker 815, a microphone 816, a camera 817, and the like.

The portable information terminal 810 includes a touch sensor in the display portion 812. All operations including making a call and inputting text can be performed by touch on the display portion 812 with a finger, a stylus, or the like.

By an operation with the operation button 813, power on/off operations and types of images displayed on the display portion 812 can be switched. For example, switching from a mail creation screen to a main menu screen can be performed.

When a detection device such as a gyroscope sensor or an acceleration sensor is provided inside the portable information terminal 810, the direction of display on the screen of the display portion 812 can be automatically changed by determining the orientation (horizontal or vertical) of the portable information terminal 810. Furthermore, the direction of display on the screen can be changed by touch on the display portion 812, operation with the operation button 813, sound input using the microphone 816, or the like.

The portable information terminal 810 has, for example, one or more functions selected from a telephone set, a notebook, an information browsing system, and the like. Specifically, the portable information terminal can be used as a smartphone. The portable information terminal 810 is capable of executing a variety of applications such as mobile phone calls, e-mailing, text viewing and writing, music replay, video replay, Internet communication, and games, for example.

Figure 12D:
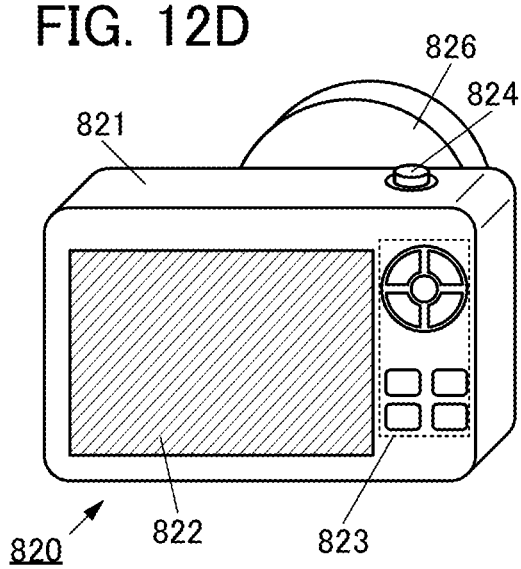

FIG. 12(D) illustrates an example of a camera. A camera 820 includes a housing 821, a display portion 822, operation buttons 823, a shutter button 824, and the like. Furthermore, a detachable lens 826 is attached to the camera 820.

Although the lens 826 of the camera 820 here is detachable from the housing 821 for replacement, the lens 826 may be integrated with the housing 821.

A still image or a moving image can be taken with the camera 820 at the press of the shutter button 824. In addition, the display portion 822 has a function of a touch panel, and images can also be taken by the touch on the display portion 822.

Note that a stroboscope, a viewfinder, or the like can be additionally attached to the camera 820. Alternatively, these may be incorporated into the housing 821.

Figure 12E:
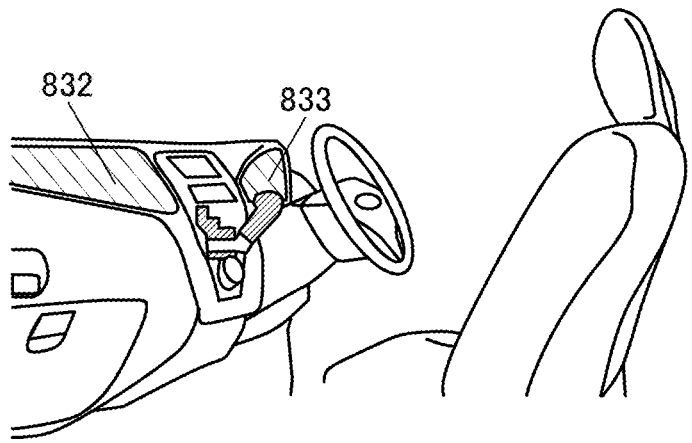

FIG. 12(E) illustrates an example in which the display device of one embodiment of the present invention is used as an in-vehicle display. A display portion 832 and a display portion 833 can provide various kinds of information by displaying navigation information, a speedometer, a tachometer, a mileage, a fuel meter, a gearshift indicator, air-conditioning settings, and the like. The content or layout of the display can be changed as appropriate in accordance with the preference of a user. The display device of one embodiment of the present invention can be used in a wide temperature range, so that display can be performed with high reliability in both low temperature environment and high temperature environment. Thus, when the display device of one embodiment of the present invention is used as an in-vehicle display, the safety of driving can be increased.

FIGS. 13(A) and 13(B) and FIGS. 14(A) and 14(B) illustrate a display system in which the display device of one embodiment of the present invention is used.

Figure 13A:
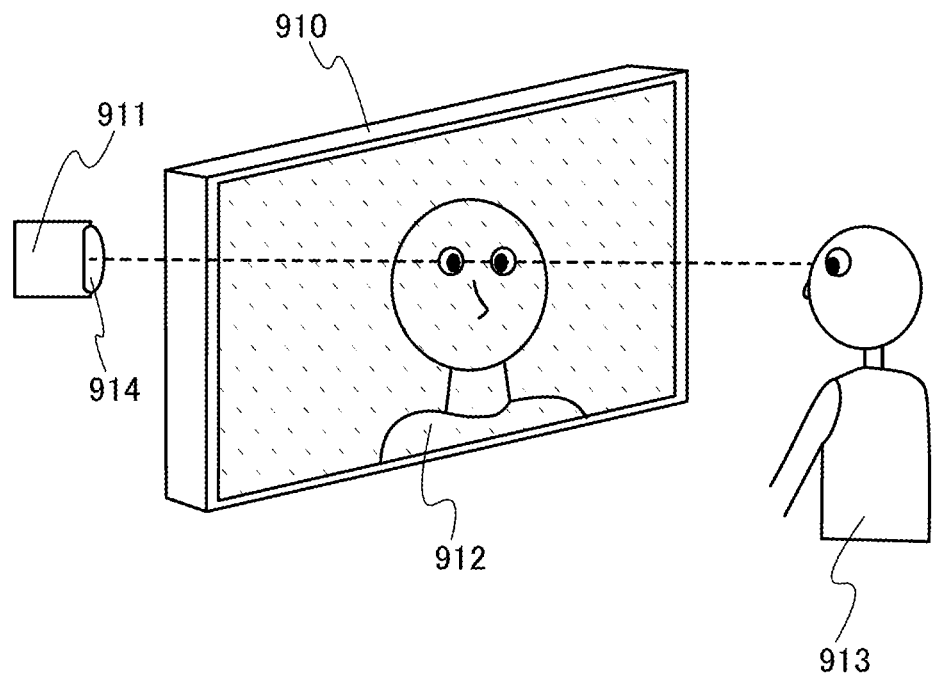
FIG. 13 (A) is a diagram illustrating an example of a display system. (B) is a diagram illustrating an example of a display system.

FIG. 13(A) is a perspective view of the display system, and the display system includes a display device 910 and an imaging device 911 placed behind the display device 910. On a first display screen 912 of the display device 910, an image of the other person is displayed. The display system illustrated in FIGS. 13(A) and 13(B) is referred to as video phone equipment in some cases.

Since the display device 910 has a function of transmitting visible light, an image of a speaker 913 can be taken with the use of the imaging device 911 placed behind the display device 910.

The speaker 913 is on the first display screen 912 side, and sees the first display surface so as to meet the other person's eyes. In the imaging device 911, specifically, a shooting lens 914 is placed so as to be on the line of sight of the speaker 913. In this case, the imaging device 911 needs to be placed within a range of distance that enables the image of the speaker 913 to be taken and with its focus on the speaker 913.

Figure 13B:
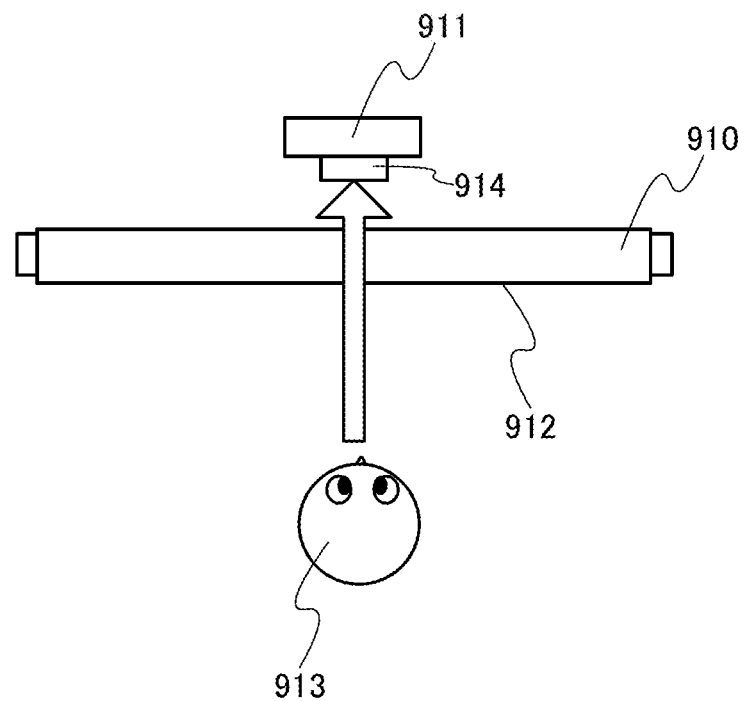

FIG. 13(B) is a top view of the video phone equipment, and illustrates the display device 910, the imaging device 911, and the first display screen 912. When the speaker 913 faces the first display screen 912, the other speaker can meet the speaker 913's eyes on the image taken by the imaging device 911.

Figure 14A:
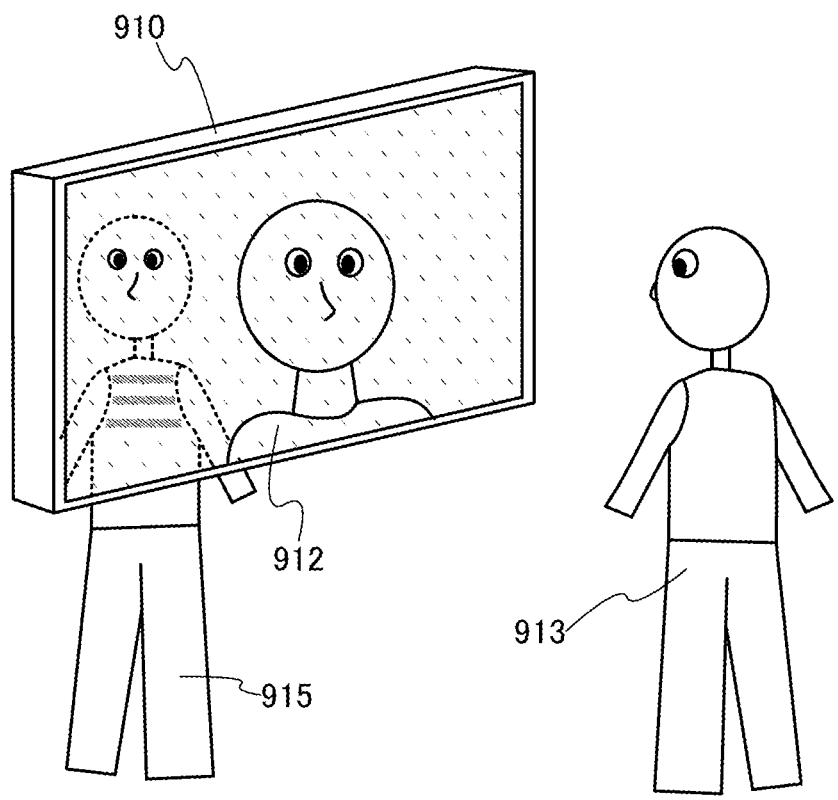
FIG. 14 (A) is a diagram illustrating an example of a display system. (B) is a diagram illustrating an example of a display system.
Figure 14B:
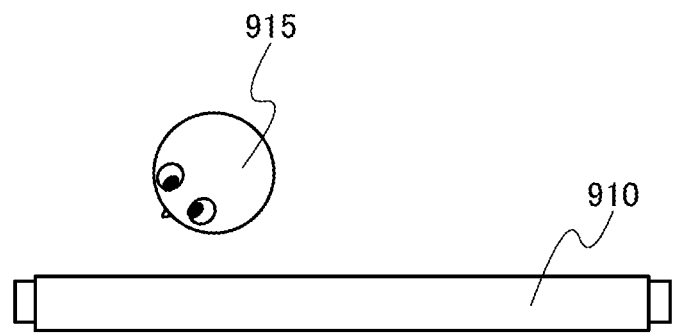
Figure 14B:
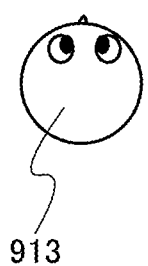

With this display system, it is possible to obtain the information behind the display device 910 while seeing an image displayed on the first display screen 912. In an example illustrated in FIG. 14(A), the speaker 913 can observe a passer 915 behind the display device 910 while seeing pictures displayed on the first display screen 912. FIG. 14(B) is a top view corresponding to FIG. 14(A). Note that the structure illustrated in FIG. 14(A) does not have to include the imaging device. As illustrated in FIGS. 14(A) and 14(B), the display system can obtain an image where the image displayed on the first display screen 912 and the information behind the display device are synthesized.

As described above, electronic devices can be obtained with the use of the display device of one embodiment of the present invention. The display device has a significantly wide application range, and can be used in electronic devices in a variety of fields.

This embodiment can be combined with the other embodiments as appropriate.

REFERENCE NUMERALS

FPCa: flexible printed circuit board, FPCb: flexible printed circuit board, GD_L: gate driver, GD_R: gate driver, GL_m: scan line, GL_m+1: scan line, IC: integrated circuit, P: region, SL_n: signal line, TCOM: common wiring, VCOM: common wiring, 10: display device, 11: pixel, 11a:

pixel, 11b: pixel, 30: backlight unit, 31: substrate, 32: substrate, 33: light-emitting element, 34: diffusion plate, 35: printed board, 36: path, 37: path, 38: light-blocking layer, 39: light guide plate, 41: conductive layer, 42: liquid crystal layer, 43b: conductive layer, 43c: conductive layer, 44: insulating layer, 46a: conductive layer, 46b: conductive layer, 46c: conductive layer, 46d: conductive layer, 61: polarizing plate, 63: polarizing plate, 100: display region, 101: transistor, 102: transistor, 103: insulating layer, 104: capacitor, 105: capacitor, 106: liquid crystal element, 107: conductive layer, 108: semiconductor layer, 108n: region, 109: substrate, 110: insulating layer, 110d: region, 111: region, 112: conductive layer, 116: insulating layer, 118: insulating layer, 120a: conductive layer, 120b: conductive layer, 121: wiring, 122: wiring, 124: wiring, 125: wiring, 135: overcoat, 141: adhesive layer, 141a: opening portion, 141b: opening portion, 172: FPC, 200: transistor, 200A: transistor, 211: insulating layer, 213: insulating layer, 214: insulating layer, 215: insulating layer, 221a: conductive layer, 221b: conductive layer, 222a: conductive layer, 222c: conductive layer, 223a: conductive layer, 223b: conductive layer, 225: insulating layer, 231a: semiconductor layer, 231a_1: semiconductor layer, 231a_m: semiconductor layer, 231ai: region, 231an: low-resistance region, 231b: semiconductor layer, 242: connector This application is based on Japanese Patent Application Serial No. 2018-066787 filed with Japan Patent Office on Mar. 30, 2018, the entire contents of which are hereby incorporated herein by reference.

The invention claimed is:

1. A display device comprising a transistor, an insulating layer, a first conductive layer, a second conductive layer, and a third conductive layer,
wherein a channel width of the transistor is greater than or equal to 30 µm and less than or equal to 1000 µm,
wherein the transistor comprises a plurality of semiconductor layers,
wherein the number of the plurality of semiconductor layers is greater than 2 and less than or equal to 50,
wherein each of the plurality of semiconductor layers comprises a channel formation region, a first region, and a second region,
wherein the channel formation region of each of the plurality of semiconductor layers is between the first region and the second region when seen from above,
wherein the channel formation region of each of the plurality of semiconductor layers comprises a metal oxide,
wherein the metal oxide comprises at least indium or zinc,
wherein the channel formation region of each of the plurality of semiconductor layers comprises a region overlapping with the first conductive layer,
wherein the second conductive layer overlaps with the first region,
wherein the third conductive layer overlaps with the second region,
wherein the first region and the second region do not overlap with the first conductive layer,
wherein the insulating layer is over the second conductive layer,
wherein the third conductive layer is over the insulating layer,
wherein the third conductive layer is in contact with at least one of the plurality of semiconductor layers,
wherein the third conductive layer is configured to transmit visible light, and
wherein the second region and the third conductive layer in a stacked state are configured to transmit visible light.

2. The display device according to claim 1,
wherein a width of the channel formation region of each of the plurality of semiconductor layers is greater than or equal to 2 µm and less than or equal to 300 µm.

3. The display device according to claim 1,
wherein the first region is one of a source region and a drain region of the transistor,
wherein the second region is the other of the source region and the drain region of the transistor,
wherein the first region and the second region have electrical resistance lower than electrical resistance of the channel formation region, and
wherein the first region and the second region comprise boron or phosphorus.

4. The display device according to claim 1, wherein the display device is configured to perform display by a field-sequential driving method.

5. The display device according to claim 1, further comprising a liquid crystal element,
wherein the liquid crystal element is a light-scattering liquid crystal element, and
wherein the liquid crystal element scatters light when being on and transmits light when being off.

6. A display device comprising a transistor, an insulating layer, a first conductive layer, a second conductive layer, and a third conductive layer,
wherein a channel width of the transistor is greater than or equal to 30 µm and less than or equal to 1000 µm,
wherein the transistor comprises a plurality of semiconductor layers,
wherein each of the plurality of semiconductor layers comprises a channel formation region, a first region, and a second region,
wherein the channel formation region of each of the plurality of semiconductor layers is between the first region and the second region when seen from above,
wherein the channel formation region of each of the plurality of semiconductor layers comprises a metal oxide,
wherein the metal oxide comprises at least indium or zinc,
wherein the channel formation region of each of the plurality of semiconductor layers comprises a region overlapping with the first conductive layer,
wherein the second conductive layer overlaps with the first region,
wherein the third conductive layer overlaps with the second region,
wherein the first region and the second region do not overlap with the first conductive layer,
wherein the insulating layer is over the second conductive layer,
wherein the third conductive layer is over the insulating layer,
wherein the third conductive layer is in contact with at least one of the plurality of semiconductor layers, and
wherein the third conductive layer is configured to transmit visible light.

7. The display device according to claim 6,
wherein a width of the channel formation region of each of the plurality of semiconductor layers is greater than or equal to 2 µm and less than or equal to 300 µm.

8. The display device according to claim 6,
wherein the first region is one of a source region and a drain region of the transistor, wherein the second region is the other of the source region and the drain region of the transistor, wherein the first region and the second region have electrical resistance lower than electrical resistance of the channel formation region, and wherein the first region and the second region comprise boron or phosphorus.

9. The display device according to claim 6, wherein the display device is configured to perform display by a field-sequential driving method.

10. The display device according to claim 6, further comprising a liquid crystal element, wherein the liquid crystal element is a light-scattering liquid crystal element, and wherein the liquid crystal element scatters light when being on and transmits light when being off.

11. The display device according to claim 6, further comprising a fourth conductive layer over the plurality of semiconductor layers, wherein the second conductive layer overlaps with the fourth conductive layer.

* * * * *